(12) United States Patent
Jung et al.

(10) Patent No.: US 9,202,775 B2
(45) Date of Patent: Dec. 1, 2015

(54) SEMICONDUCTOR DEVICES HAVING BIT LINE STRUCTURES DISPOSED IN TRENCHES

(71) Applicant: SK HYNIX INC., Icheon (KR)

(72) Inventors: Jin Ki Jung, Yongin (KR); Myoung Soo Kim, Seongnam (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/178,127

(22) Filed: Feb. 11, 2014

(65) Prior Publication Data

US 2015/0028492 A1  Jan. 29, 2015

(30) Foreign Application Priority Data

Jul. 26, 2013 (KR) .................. 10-2013-0089154

(51) Int. Cl.
*H01L 23/48* (2006.01)
(52) U.S. Cl.
CPC ..... *H01L 23/481* (2013.01); *H01L 2224/48091* (2013.01); *H01L 2224/48227* (2013.01); *H01L 2924/15311* (2013.01)
(58) Field of Classification Search
CPC .................. H01L 23/5329; H01L 27/10814; H01L 27/10855; H01L 23/5222; H01L 23/53266; H01L 23/528; H01L 27/10876; H01L 27/0885; H01L 21/7682; H01L 23/481; H01L 23/48; H01L 2224/48227; H01L 2924/15311; H01L 2224/48091; H01L 2924/00014

USPC .................. 257/774, 306, 773, 751
See application file for complete search history.

(56) References Cited

U.S. PATENT DOCUMENTS

| | | | |
|---|---|---|---|
| 2008/0093741 A1* | 4/2008 | Lee | 257/755 |
| 2009/0163011 A1* | 6/2009 | Jung | 438/589 |
| 2012/0012912 A1* | 1/2012 | Kwon | 257/302 |
| 2012/0112269 A1* | 5/2012 | Kim | 257/330 |
| 2012/0156869 A1* | 6/2012 | Shin et al. | 438/589 |
| 2012/0168899 A1 | 7/2012 | Kim et al. | |
| 2012/0179101 A1* | 7/2012 | Briones et al. | 604/151 |
| 2013/0093093 A1* | 4/2013 | Lee | 257/770 |
| 2013/0181271 A1* | 7/2013 | Oyu et al. | 257/296 |
| 2013/0193549 A1* | 8/2013 | Lee | 257/508 |
| 2014/0061745 A1* | 3/2014 | Myung et al. | 257/302 |
| 2014/0134812 A1* | 5/2014 | Kim et al. | 438/270 |
| 2014/0179102 A1* | 6/2014 | Joung et al. | 438/666 |
| 2014/0299989 A1* | 10/2014 | Lim et al. | 257/751 |
| 2014/0306351 A1* | 10/2014 | Kim | 257/774 |
| 2014/0361403 A1* | 12/2014 | Cho et al. | 257/532 |
| 2015/0014759 A1* | 1/2015 | Lee et al. | 257/306 |
| 2015/0061134 A1* | 3/2015 | Lee et al. | 257/751 |

FOREIGN PATENT DOCUMENTS

KR  10-2011-0024494 A  3/2011

* cited by examiner

*Primary Examiner* — Alexander Oscar Williams

(57) ABSTRACT

Semiconductor devices are provided. The semiconductor device includes a bit line contact plug and a storage node contact plug electrically connected to an active region of a substrate. A bit line structure is disposed on the bit line contact plug to extend in a first direction. The bit line structure is disposed in a trench pattern that intrudes into a side of the storage node contact plug. Related methods and systems are also provided.

13 Claims, 26 Drawing Sheets

SEMICONDUCTOR DEVICES HAVING BIT LINE STRUCTURES DISPOSED IN TRENCHES

CROSS-REFERENCE TO RELATED APPLICATION

The present application claims priority under 35 U.S.C 119(a) to Korean Application No. 10-2013-0089154, filed on Jul. 26, 2013, in the Korean intellectual property Office, which is incorporated herein by reference in its entirety.

BACKGROUND

1. Technical Field

Embodiments of the present disclosure relate to semiconductor devices and, more particularly, to semiconductor devices having bit line structures disposed in trenches, methods of fabricating the same, and packages, modules, and systems including the same.

2. Related Art

In general, semiconductor memory devices such as dynamic random access memory (DRAM) devices may include a plurality of cell transistors formed in and on active regions of a substrate. A first end (e.g., a source region) and a second end (e.g., a drain region) of each cell transistor may be connected to a storage node contact and a bit line contact, respectively. The storage node contacts may be electrically connected to cell capacitors, and the bit line contacts may be electrically connected to bit lines. As such, the cell transistors and the cell capacitors may act as memory cells of the semiconductor memory device. Recently, as semiconductor devices including memory devices become more highly integrated, critical dimensions (CDs) of lines constituting the cell transistors and the cell capacitors have been continuously reduced. Thus, the number of storage node contacts and bit line contacts integrated in a limited area has been increased.

As a result of the integration of semiconductor memory devices, a thickness of an interlayer insulation layer between the storage node contact and the bit line contact (or a bit line) may be reduced. Accordingly, the probability of an electrical short between a storage node contact and a bit line contact (or a bit line) adjacent to each other may increase, or a parasitic capacitance value between conductive lines may increase. Recently, various structures for improving electrical insulation characteristics between the storage node contact and the bit line contact (or the bit line) have been proposed. For example, a structure with a buried gate and a contact hole space is taught in US patent publication No. US 2012/0217576 A1. Further, a structure employing an air gap for preventing a parasitic capacitance value between the conductive lines from increasing is taught in US patent publication No. US 2012/0168899 A1.

SUMMARY

Various embodiments are directed to semiconductor devices having bit line structures disposed in trenches, methods of fabricating the same, and packages, modules, and systems including the same.

According to some embodiments, a semiconductor device includes a bit line contact plug and a storage node contact plug electrically connected to an active region of a substrate. A bit line extending in a first direction is disposed on the bit line contact plug. The bit line is disposed in a trench pattern that intrudes into a side of the storage node contact plug.

According to further embodiments, a semiconductor device includes a trench pattern and a line structure disposed in the trench pattern. The trench pattern is disposed between a pair of first conductive plugs to extend in one direction. The trench pattern includes recesses intruding into opposing sidewalls of the pair of first conductive plugs. The line structure is disposed on a second conductive plug which is spaced apart from the pair of first conductive plugs.

According to further embodiments, a method of fabricating a semiconductor device includes forming a storage node contact hole and a bit line contact hole exposing portions of an active region in a substrate, filling the storage node contact hole and the bit line contact hole with a conductive layer to form a first contact plug and a second contact plug, recessing portions of the first contact plug and the second contact plug to form a trench pattern extending in one direction, and forming a bit line structure in the trench pattern.

According to further embodiments, a semiconductor package includes a package substrate and a semiconductor device mounted on the package substrate. The semiconductor device includes a bit line contact plug and a storage node contact plug electrically connected to an active region of a substrate, and a bit line structure disposed on the bit line contact plug to extend in one direction. The bit line structure is disposed in a trench pattern that intrudes into a sidewall of the storage node contact plug.

According to further embodiments, a package module includes a printed circuit board and a semiconductor package connected to the printed circuit board. The semiconductor package includes a semiconductor device mounted on a package substrate. The semiconductor device includes a bit line contact plug and a storage node contact plug electrically connected to an active region of a substrate, and a bit line structure disposed on the bit line contact plug to extend in one direction. The bit line structure is disposed in a trench pattern that intrudes into a sidewall of the storage node contact plug.

According to further embodiments, a processing system includes a processor, a main memory unit, a storage unit and a control unit that communicate with each other through a system bus. The main memory unit includes at least one semiconductor device. The at least one semiconductor device includes a bit line contact plug and a storage node contact plug electrically connected to an active region of a substrate, and a bit line structure disposed on the bit line contact plug to extend in one direction. The bit line structure is disposed in a trench pattern that intrudes into a sidewall of the storage node contact plug.

According to further embodiments, a graphics card includes a processor, a DRAM device, an interconnection unit and an output unit that communicate with each other through a system bus. The DRAM device includes at least one semiconductor device. The at least one semiconductor device includes a bit line contact plug and a storage node contact plug electrically connected to an active region of a substrate, and a bit line structure disposed on the bit line contact plug to extend in one direction. The bit line structure is disposed in a trench pattern that intrudes into a sidewall of the storage node contact plug.

According to further embodiments, a mobile system includes a processor, a memory unit, a communication unit, a multimedia unit and a touch input unit that communicate with each other through a system bus. The memory unit includes at least one semiconductor device. The at least one semiconductor device includes a bit line contact plug and a storage node contact plug electrically connected to an active region of a substrate, and a bit line structure disposed on the bit line contact plug to extend in one direction. The bit line structure is disposed in a trench pattern that intrudes into a sidewall of the storage node contact plug.

According to further embodiments, an electronic system includes a processor, a DRAM device and an interface unit that communicate with each other through a system bus. The DRAM device includes at least one semiconductor device. The at least one semiconductor device includes a bit line contact plug and a storage node contact plug electrically connected to an active region of a substrate, and a bit line structure disposed on the bit line contact plug to extend in one direction. The bit line structure is disposed in a trench pattern that intrudes into a sidewall of the storage node contact plug.

BRIEF DESCRIPTION OF THE DRAWINGS

Embodiments of the present disclosure will become more apparent in view of the attached drawings and accompanying detailed description, in which:

FIGS. 4A to 10A are plan views illustrating a semiconductor device and fabrication method according to an embodiment of the present disclosure;

FIGS. 4B to 10B are cross-sectional views taken along lines A-A' of FIGS. 4A to 10A, respectively;

DETAILED DESCRIPTION OF THE EMBODIMENTS

Figure 1A:
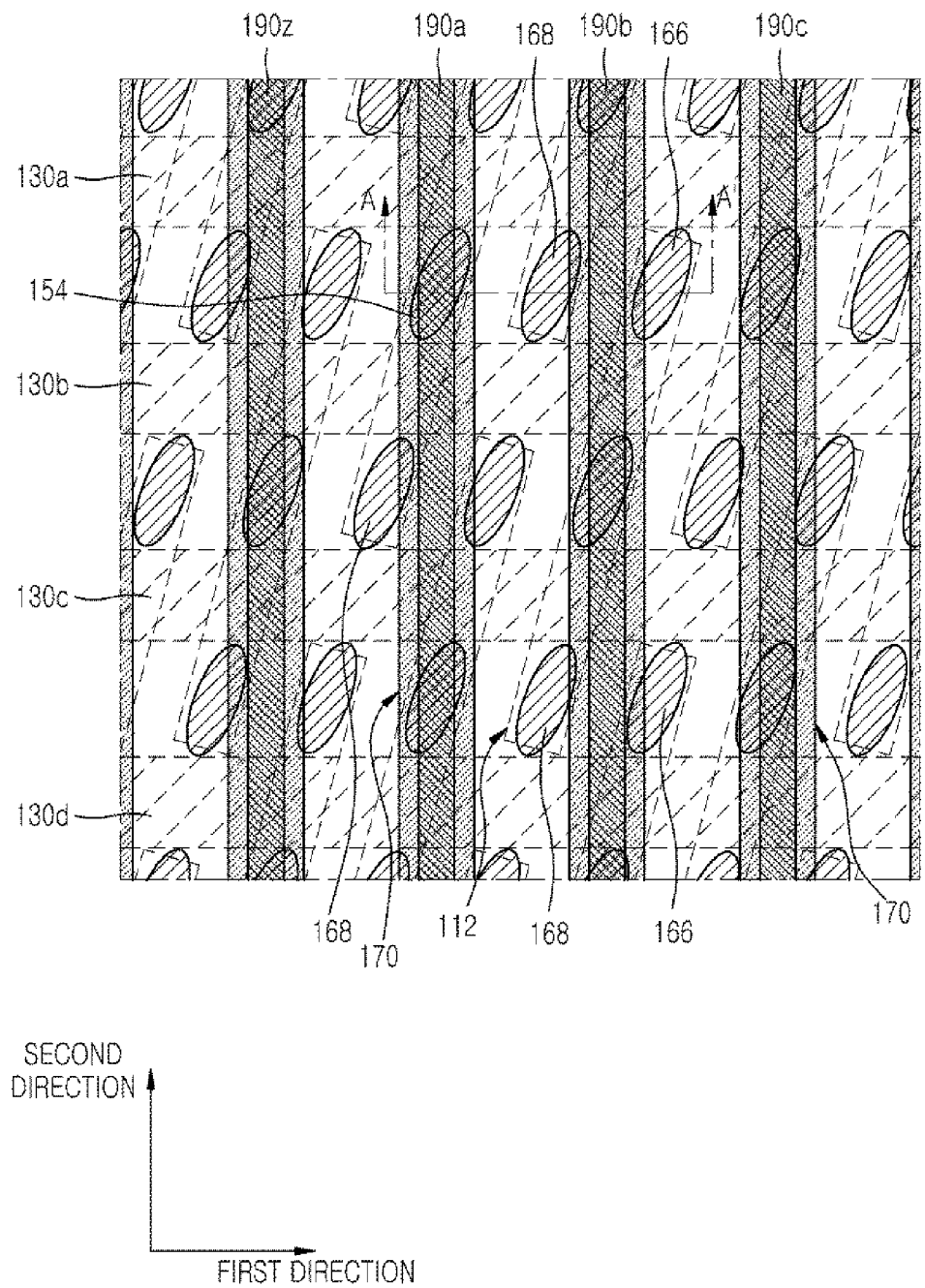
FIG. 1A is a planar layout diagram illustrating a portion of a semiconductor device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the present disclosure to those skilled in the art. In the drawing figures, the dimensions of layers and regions may be exaggerated for clarity of illustration.

It will be understood that when an element is referred to as being "on" another element, it can be directly "on" the other element, or intervening elements may also be present. In the drawings, like reference numerals or like reference designators denote substantially like elements throughout. Furthermore, as used herein, the singular terms "a," "an" and "the" are intended to include the plural forms as well, unless the context clearly indicates otherwise.

It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Moreover, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an alternative sequence, and some of the process steps of the methods may be simultaneously performed.

In an embodiment, an active region of a substrate may be a region in which a source, a drain and a channel layer of a transistor are formed. The active region may have a major axis and a minor axis. The active region may have an oval shape or a polygonal shape, but embodiments are not limited thereto.

Hereinafter, embodiments will be described in conjunction with DRAM devices as an example of semiconductor devices. Specifically, the DRAM device may be designed to have a $6F^2$ cell layout. The character "F" means a minimum feature size (MFS) that can be defined in a lithography process. In the $6F^2$ cell layout, active regions may be disposed such that major axes of the active regions are non-perpendicular to bit lines and word lines. Thus, the $6F^2$ cell layout may have an advantage of a high integration density as compared with an $8F^2$ cell layout. However, the $6F^2$ cell layout is merely an example of a cell layout for a DRAM device. That is, although examples in this disclosure use a $6F^2$ layout, other embodiments may use other layouts. Similarly, the following embodiments may be equally applicable to other semiconductor devices employing a structure for suppressing the electrical shortage between adjacent conductive lines or for limiting a parasitic capacitance value between adjacent conductive lines.

According to embodiments of the present disclosure, a semiconductor device may include a conductive line structure which is disposed between a pair of first conductive plugs adjacent to each other and parallel in a first direction. The conductive line structure may extend in the first direction to be coupled to a second conductive plug which is spaced apart from the pair of first conductive plugs. In some embodiments, the first conductive plugs may correspond to storage node contact plugs, and the second conductive plug may correspond to a bit line contact plug. In addition, the conductive line structure may be a bit line. The bit line may be electrically insulated from the first conductive plugs (e.g., the storage node contact plugs) by an insulation layer formed on sidewalls and a bottom surface of the trench pattern. The semiconductor device may further include air gaps which are disposed between the insulation layer and the sidewalls of the trench pattern.

Figure 1B:
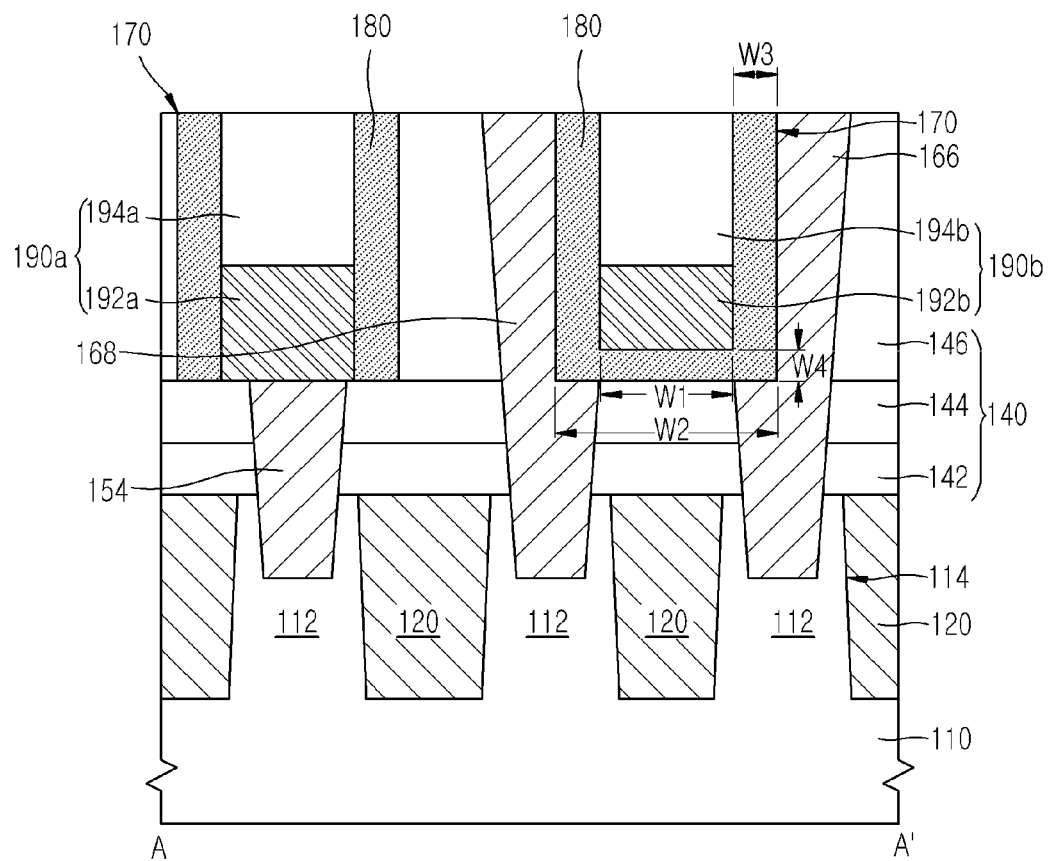
FIG. 1B is a cross-sectional view taken along a line A-A' of FIG. 1A.

Referring to FIGS. 1A and 1B, a plurality of active regions 112 may be disposed in a substrate 110 to be suitable for the $6F^2$ cell layout. As illustrated in FIG. 1A, the plurality of active regions 112 may be disposed such that major axes of the active regions 112 intersect a first direction and a second direction. That is, the major axes of the active regions 112 may be nonparallel with both the first and second direction. The active regions 112 may be spatially isolated from each other by an isolation region 120.

A plurality of word line structures 130a, 130b, 130c and 130d may be arrayed in the second direction to be parallel with the first direction, and a plurality of bit line structures 190z, 190a, 190b and 190c may be arrayed in the first direction to be parallel with the second direction. The word line structures 130a, 130b, 130c and 130d may be disposed in a plurality of trenches which are formed in the substrate 110 to cross the active regions 112 and the isolation region 120. That is, the word line structures 130a, 130b, 130c and 130d may correspond to buried gate structures. Each of the buried gate structures may include a gate oxide layer, a gate conductive layer and a capping insulation layer. Each of the bit line structures 190z, 190a, 190b and 190c may be electrically connected to bit line contact plugs 154 disposed thereunder and may be arrayed to pass through a region between adjacent storage node contact plugs 166 and 168.

Referring to FIG. 1B, the bit line contact plugs 154 and the storage node contact plugs 166 and 168 may be disposed to be electrically connected to the active regions 112. Each of the bit line contact plugs 154 and the storage node contact plugs 166 and 168 may include a conductive layer, for example, a metal layer, a metal nitride layer or a doped silicon layer.

As illustrated in FIGS. 1A and 1B, each of the bit line structures 190z, 190a, 190b and 190c may include a bit line conductive pattern 192a (or 192b) and a bit line hard mask pattern 194a (or 194b) which are sequentially stacked. Each of the bit line conductive patterns 192a and 192b may include a conductive layer, for example, a tungsten layer or a tungsten nitride layer. Each of the bit line hard mask patterns 194a and 194b may include an insulation layer, for example, an oxide layer or a nitride layer. Each of the bit line structures 190z, 190a, 190b and 190c may be disposed on the bit line contact plugs 154 and may be disposed in a trench pattern 170 between the storage node contact plugs 166 and 168 adjacent to each other.

The trench pattern 170 may intrude into sides of the storage node contact plugs 166 and 168. In other words, the trench pattern 170 extends into storage node contact plugs 166 and 168 in a depth dimension and a lateral dimension. As seen in FIGS. 1A and 1B, in an embodiment, trench pattern 170 overlaps with a portion of storage contact plugs 166 and 168 horizontally and vertically. Accordingly, a lower sidewall of each storage contact plug 166 and 168 is disposed under the trench 170, while an upper sidewall of each storage node contact plug is shared with a sidewall of the trench. Contiguous portions of the storage node contact plugs 166 and 168 are disposed underneath and on sides of the trench 170.

Each of the bit line structures 190z, 190a, 190b and 190c may be electrically insulated from the storage node contact plugs 166 and 168 by an insulation layer 180 disposed in the trench pattern 170. In bit line contact regions where the bit line structures 190z, 190a, 190b and 190c contact bit line contact plugs 154, the insulation layer 180 may be disposed on sidewalls of the trench patterns 170. Further, in regions where the bit line structures 190z, 190a, 190b and 190c do not contact the bit line contact plugs 154, the insulation layer 180 may be disposed on sidewalls and bottom surfaces of the trench patterns 170. In some embodiments, the insulation layer 180 on the sidewalls of the trench patterns 170 may have a spacer shape. The insulation layer 180 may include, for example, an oxide layer, a nitride layer or a combination thereof.

As illustrated in FIG. 1B, the bit line structures 190a and 190b may be disposed to fill the trench patterns 170 over the insulation layer 180. In such a case, a width W1 of each bit line structure 190a or 190b may be determined by a width W2 of the trench patterns 170 and a thickness W3 of the insulation layer 180. A thickness W3 or W4 of the insulation layer 180 may be increased to improve electrical insulation between the bit line structures 190a and 190b and the storage node contact plugs 166 and 168. In such a case, the width W2 of the trench patterns 170 may also be increased to prevent the width W1 of the bit line structures 190a and 190b from being reduced.

In addition, the insulation layer 180 may be formed of a low-k dielectric material to reduce a parasitic capacitance value between the bit line structures 190a and 190b and the storage node contact plugs 166 and 168. For example, the insulation layer 180 may be formed of an oxide layer rather than a nitride layer. As described in the following embodiment, air gaps may be additionally disposed between the insulation layer 180 and sidewalls of the trench patterns 170 to reduce a parasitic capacitance value between the bit line structures 190a and 190b and the storage node contact plugs 166 and 168.

Referring again to FIG. 1B, an insulation structure 140 may be disposed between the bit line contact plug 154 and the storage node contact plugs 166 and 168 to electrically insulate the bit line contact plug 154 from the storage node contact plugs 166 and 168. As illustrated in FIG. 1B, the insulation structure 140 may include first to third insulation layers 142, 144 and 146 which are sequentially stacked, but embodiments are not limited thereto. For example, the insulation structure 140 may include at least one insulation layer. In the insulation structure 140, the first insulation layer 142 may act as a hard mask for forming the buried gate structures, and the second insulation layer 144 may act as an etch stop layer which is used in formation of the trench patterns 170. The third insulation layer 146 may be stacked to determine a height of the bit line structures 190a and 190b.

Although not shown in the drawings, in an embodiment, capacitors (e.g., cell capacitors) may be disposed on the storage node contact plugs 166 and 168. Each of the capacitors may include a storage node electrode electrically connected to the corresponding storage node contact plug, a capacitor dielectric layer on the storage node electrode, and an upper electrode on the capacitor dielectric layer.

Although not illustrated in the drawings, in an embodiment, second storage node contact plugs may be disposed on and electrically coupled to the storage node contact plugs 166 and 168. In some embodiments, a width of the second storage node contact plugs is greater than an upper width of the storage node contact plugs 166 and 168. That is, the second storage node contact plugs may recover a width of the storage node contact plugs 166 and 168 that is reduced because of the intrusion of the trench patterns 170. As a result, contact resistance values between the second storage node contact plugs and capacitors formed in a subsequent process may be reduced, and an alignment margin between the second storage node contact plugs and the capacitors may be increased. Storage node electrodes may be disposed on the second storage node contact plugs, and a capacitor dielectric layer and an upper electrode may be sequentially stacked on the second storage node contact plugs.

Figure 2:
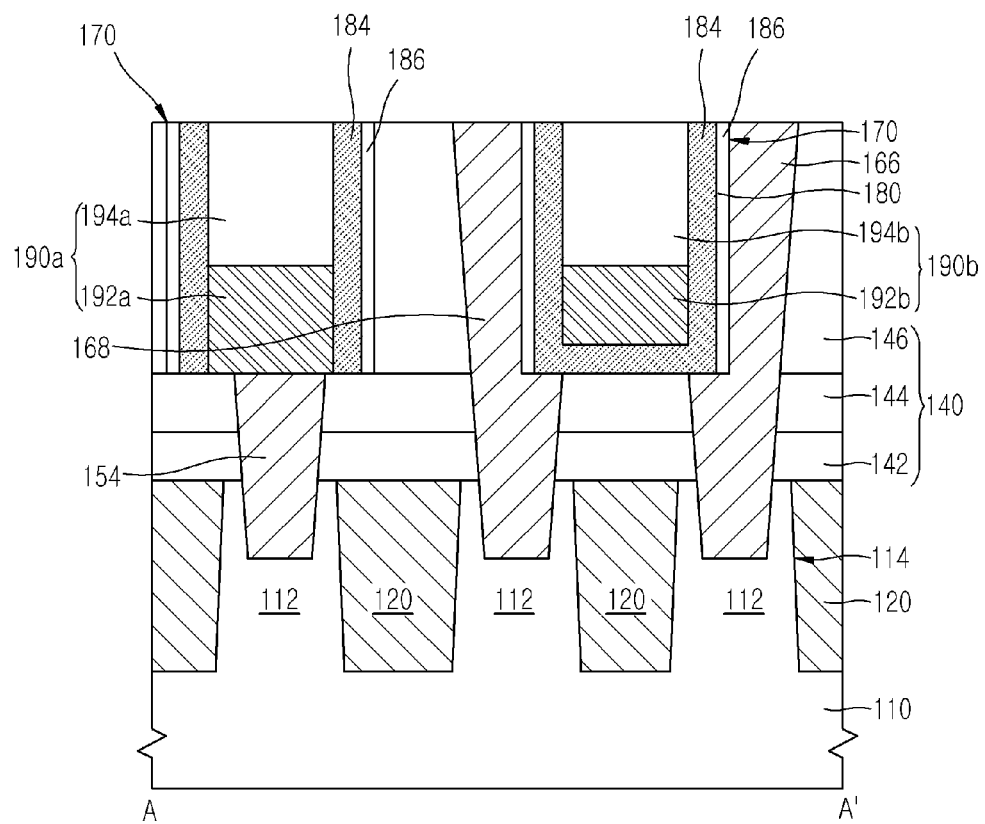
FIG. 2 is a cross-sectional view illustrating a semiconductor device according to another embodiment of the present disclosure.

Referring to FIG. 2, a semiconductor device according to an embodiment may have substantially the same configuration as the previous embodiment illustrated in FIGS. 1A and 1B except that the insulation layer 180 of the previous embodiment is replaced with an insulation layer 184 and an air gap 186. The air gap 186 may be disposed between the insulation layer 184 and sidewalls of the trench patterns 170. The air gap 186 may reduce a parasitic capacitance value between the bit line structures 190a and 190b and the storage node contact plugs 166 and 168. Fabrication methods of the air gap 186 are disclosed in US patent publication No. US 2012/0168899 A1, the disclosure of which is incorporated herein by reference.

Figure 3:
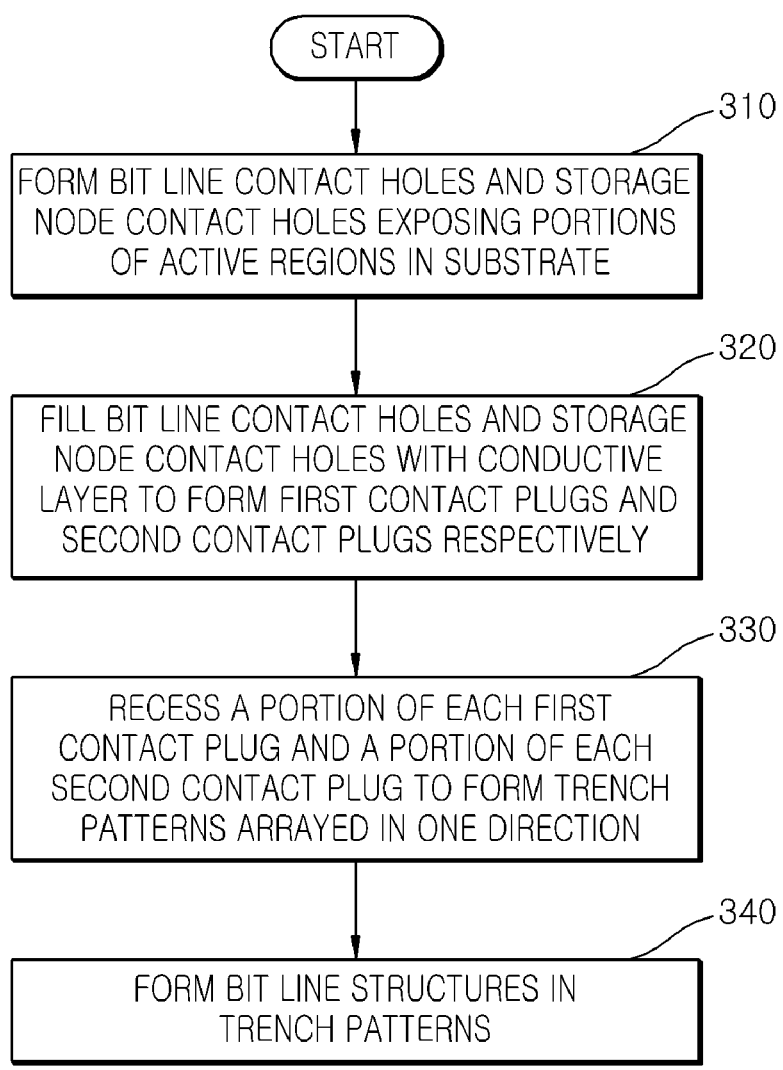
FIG. 3 is a flowchart illustrating a method of fabricating a semiconductor device according to an embodiment of the present disclosure.

FIG. 3 illustrates a process 300 of fabricating a semiconductor device according to an embodiment. Referring to FIG. 3, in step 310 bit line contact holes and storage node contact holes are formed to expose portions of active regions in a substrate. According to some embodiments, an insulation structure may be formed on the substrate including the active regions and the insulation structure may be patterned to simultaneously form the bit line contact holes and the storage node contact holes.

Subsequently, in step 320 the bit line contact holes and the storage node contact holes may be filled with a conductive layer to form first contact plugs in the bit line contact holes and second contact plugs in the storage node contact holes. Each of the first and second contact plugs may be formed to include a metal layer, a metal nitride layer, a doped silicon layer or the like.

In step 330, a portion of each of the first contact plugs and a portion of each of the first contact plugs may be recessed to form trench patterns which are arrayed in one direction. According to some embodiments, the trench patterns may be formed by etching the first contact plugs, the second contact plugs and the insulation structure such that the trench patterns extend into the second contact plugs.

Bit line structures may then be formed in respect ones of the trench patterns. According to some embodiments, an insulation layer may be formed on sidewalls and bottom surfaces of the trench patterns and the insulation layer may be selectively patterned to expose a portion of each of the first contact plugs. After selectively patterning the insulation layer, conductive line structures including a conductive layer may be formed in the trench patterns. The conductive line structures may correspond to bit line structures. Each of the bit line structures may be formed to include a bit line conductive pattern and a bit line hard mask pattern. The bit line conductive pattern may be formed to include a conductive layer such as a tungsten layer or a tungsten nitride layer. The bit line hard mask pattern may be formed to include an insulation layer such as an oxide layer, a nitride layer or an oxynitride layer.

Figure 4A:
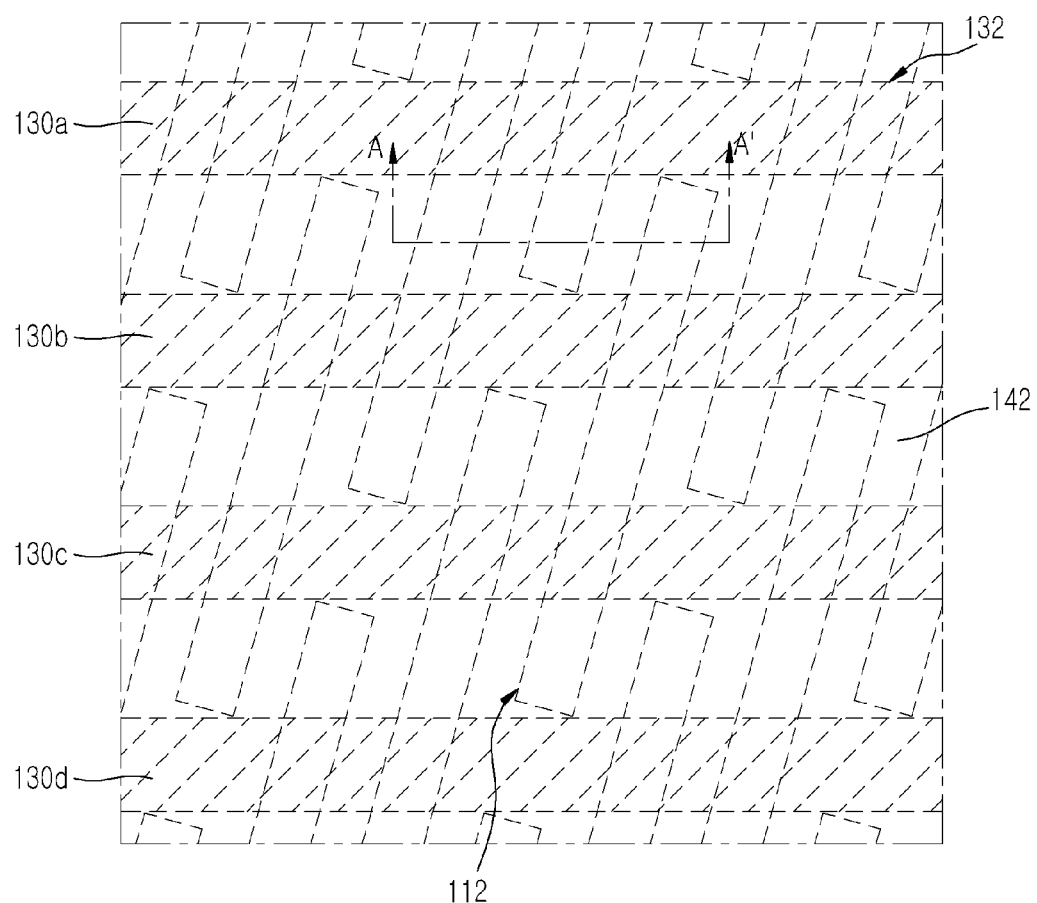
Figure 4A:
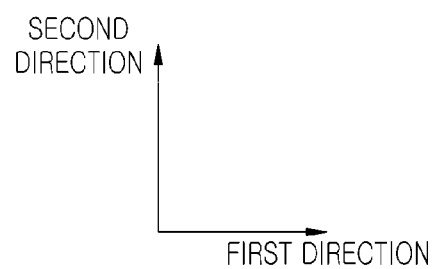
Figure 4B:
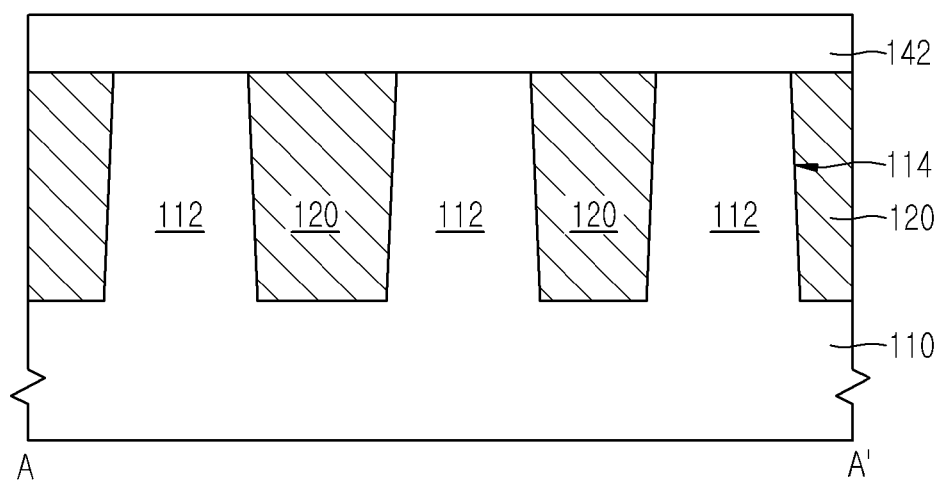

FIGS. 4A to 10B illustrate semiconductor devices and methods for manufacturing the semiconductor devices according to embodiments. Referring to FIGS. 4A and 4B, an isolation region 120 may be formed in a substrate 110 to define active regions 112. The active regions 112 may be arrayed such that major axes and minor axes of the active regions 112 are nonparallel with a first direction and a second direction that crosses the first direction at a right angle. The isolation region 120 may be formed using a shallow trench isolation (STI) process and may be formed to surround sidewalls of the active regions 112.

In some embodiments, the isolation region 120 may be formed by etching the substrate 110 to form isolation trenches 114 and by filling the isolation trenches 114 with an insulation layer. The insulation layer may be formed of, for example, an oxide layer, a nitride layer or an oxynitride layer. In some embodiments, a liner layer (not shown) may be additionally formed on sidewalls of the isolation trenches 114 before filling the isolation trenches 114 with the insulation layer.

Referring again to FIGS. 4A and 4B, word line structures 130a, 130b, 130c and 130d may be formed to cross a portion of each active region 112 and to extend in the first direction. In some embodiments, the word line structures 130a, 130b, 130c and 130d may be formed to have a buried gate structure. A method of forming the word line structures 130a, 130b, 130c and 130d having a buried gate structure will be described hereinafter.

Referring again to FIG. 4A, a first insulation layer 142 may be formed on the substrate 110 (e.g., the active regions 112) and the isolation region 120. The first insulation layer 142 may be formed of, for example, an oxide layer, a nitride layer or an oxynitride layer. The first insulation layer 142 may act as a hard mask layer when the substrate 110 is etched in a subsequent process. The first insulation layer 142 and the substrate 110 may be selectively etched to form trenches 132 that cross the active regions 112 and the isolation region 120 between the active regions 112 and extend in the first direction. A gate oxide layer (not shown) may be formed on sidewalls and bottom surfaces of the trenches 132. A gate conductive layer (not shown) may be formed to partially fill the trenches 132 and a capping insulation layer may be formed on the gate conductive layer. The capping insulation layer may be formed of, for example, an oxide layer, a nitride layer or an oxynitride layer.

Figure 5A:
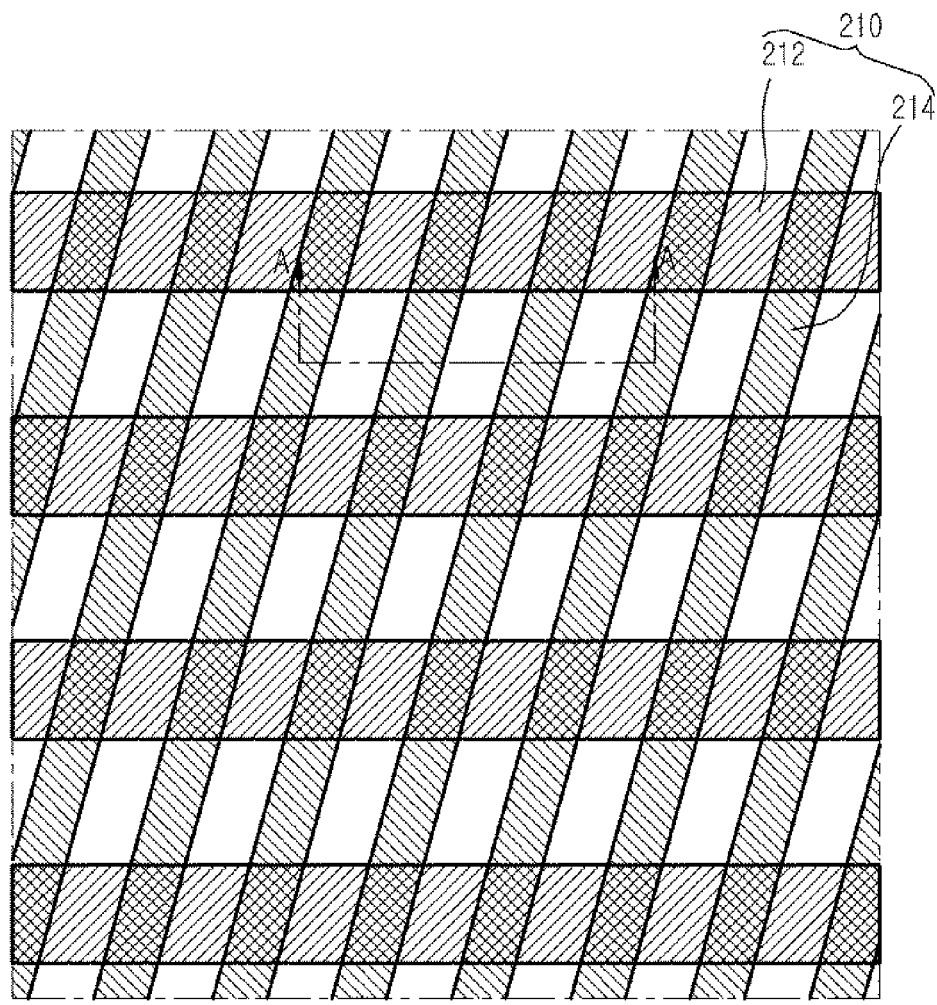
Figure 5A:
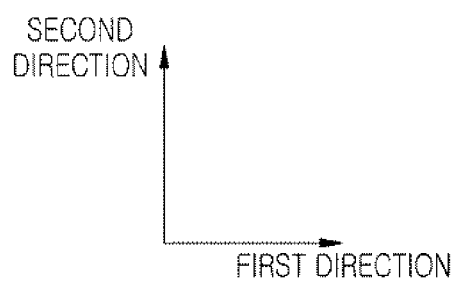
Figure 5B:
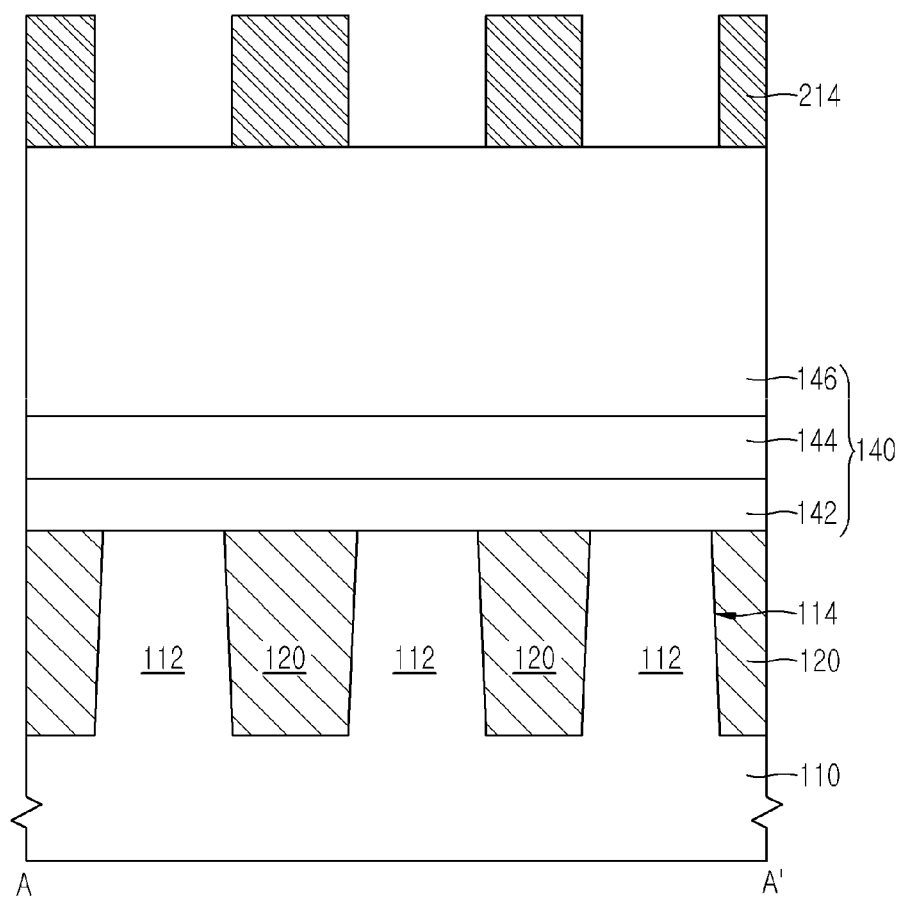

Referring to FIGS. 5A and 5B, a second insulation layer 144 and a third insulation layer 146 may be sequentially formed on the first insulation layer 142 and the word line structures 130a, 130b, 130c and 130d. The first, second and third insulation layers 142, 144 and 146 may constitute an insulation structure 140. According to an embodiment, when the first insulation layer 142 is formed of an oxide layer, the second insulation layer 144 may be formed of a nitride layer and the third insulation layer 146 may be formed of an oxide layer. The second insulation layer 144 may act as an etch stop layer when trench patterns 170 are formed in a subsequent process. The third insulation layer 146 may be formed to have a thickness corresponding to a height of bit line structures 190a and 190b which are formed in a subsequent process.

In other embodiments, insulation structure 140 may be have other configurations. For example, the insulation structure 140 may be formed to include only two layers such as second and third insulation layers 144 and 146. Alternatively, the insulation structure 140 may include only the third insulation layer 146 or may include four or more insulation layers.

Referring again to FIGS. 5A and 5B, a mask pattern 210 may be formed on the insulation structure 140. The mask pattern 210 may be formed to include a first pattern 214 parallel with major axes of the active regions 112 and a second pattern 212 parallel with the first direction. The mask pattern 210 may be formed on the third insulation layer 146 to expose portions where bit line contact holes and storage node contact holes are formed in subsequent processes.

According to some embodiments, the mask pattern 210 may be a hard mask pattern or a mesh-shaped resist pattern that has a plurality of holes. For example, the mask pattern 210 may include a single layer pattern having a plurality of holes, or a multi-layered pattern including line/space patterns crossing each other. In some embodiments, the mask pattern 210 may be formed using a double exposure process or a double pattering process. Embodiments of the double pattering process or the double exposure process is disclosed in U.S. Pat. No. 8,308,966 or Korean laid-open patent No. 2009-0103145, the disclosures of which are incorporated herein by references.

Figure 6A:
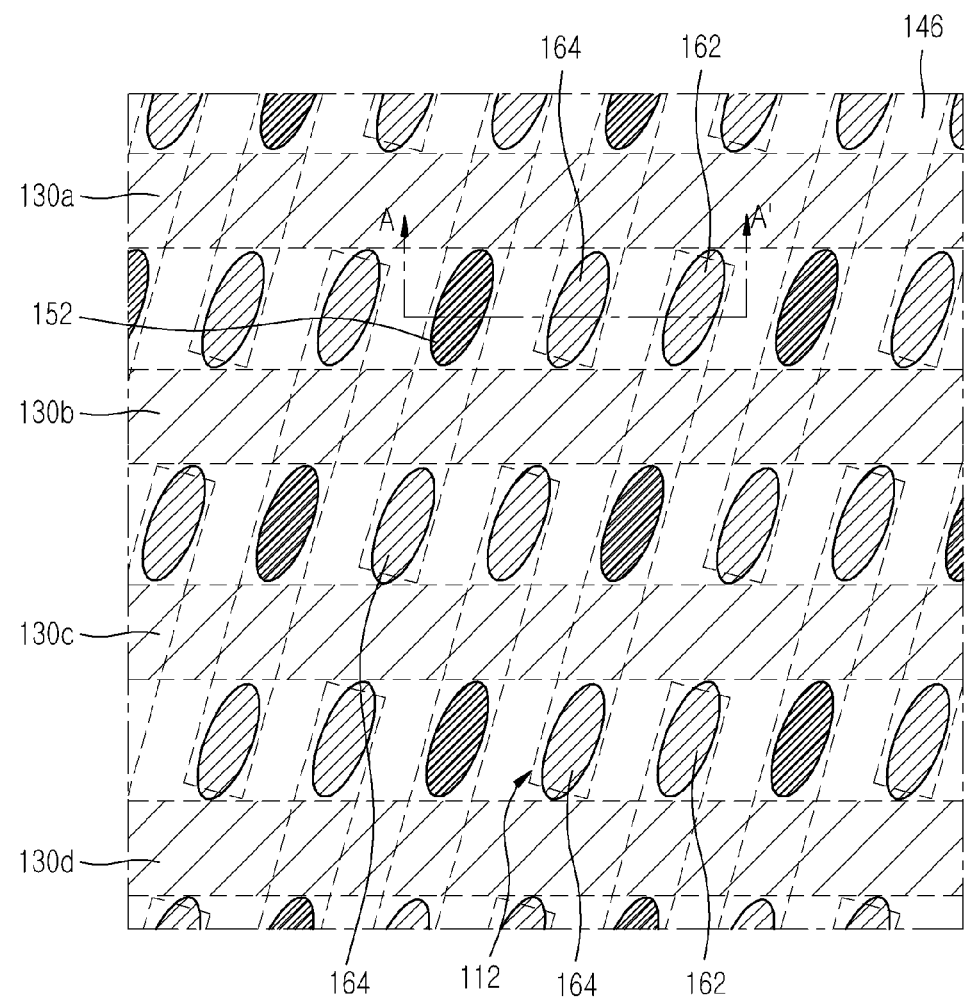
Figure 6B:
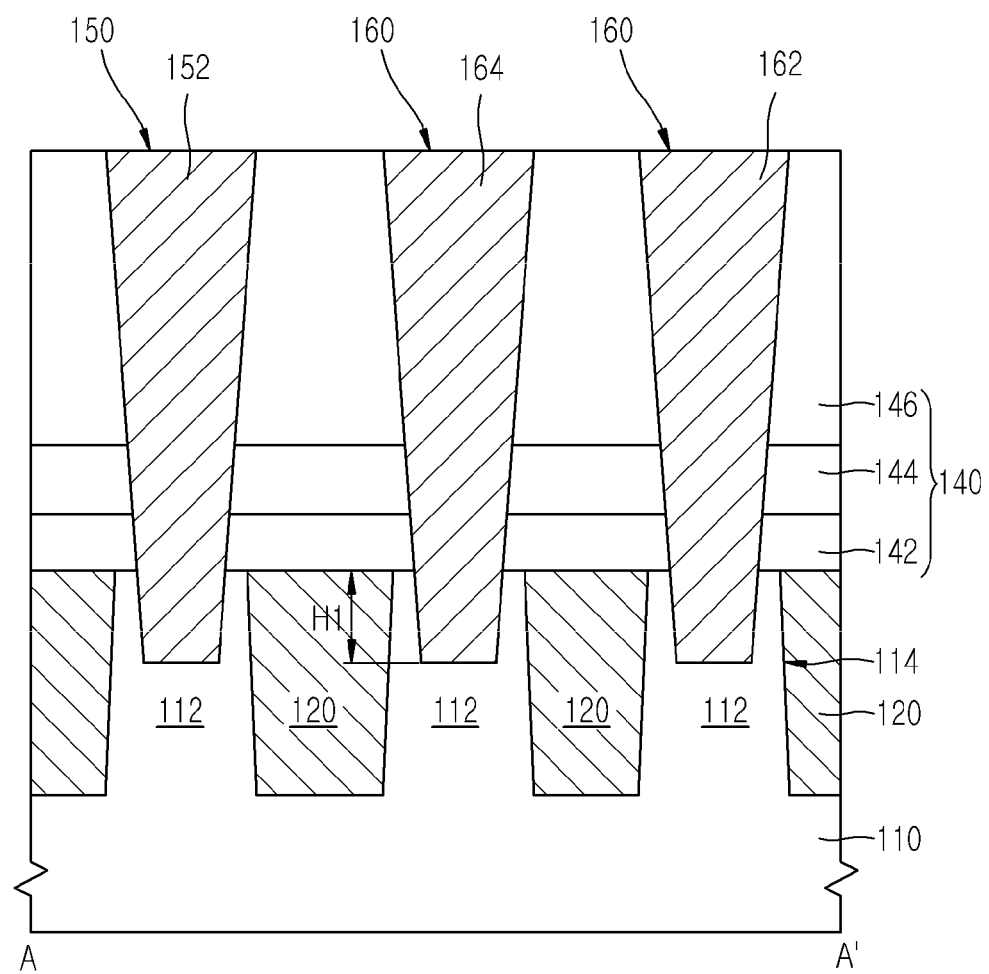

Referring to FIGS. 6A and 6B, the insulation structure 140 may be selectively etched using the mask pattern 210 as an etch mask, thereby forming bit line contact holes 150 and storage node contact holes 160. As illustrated, the bit line contact holes 150 and the storage node contact holes 160 may be formed to expose the corresponding active regions 112. In some embodiments, the bit line contact holes 150 and the storage node contact holes 160 may be formed to infiltrate into the active regions 112 by a predetermined depth H1. According to some embodiments, the bit line contact holes 150 and the storage node contact holes 160 may be simultaneously formed.

Subsequently, the bit line contact holes 150 and the storage node contact holes 160 may be filled with a conductive layer to form first contact plugs 152 in the bit line contact holes 150 and second contact plugs 162 and 164 in the storage node contact holes 160. The first and second contact plugs 152, 162 and 164 may be formed of a conductive layer such as a metal layer, a metal nitride layer or a doped silicon layer. The metal layer may include a tungsten layer, and the metal nitride layer may include a tungsten nitride layer.

According to some embodiments, the first and second contact plugs 152, 162 and 164 may be formed according to the following process. First, one of the above-listed conductive layers may be formed to fill the bit line contact holes 150 and the storage node contact holes 160 using a chemical vapor deposition (CVD) process, a physical vapor deposition (PVD) process or the like. After filling the bit line contact holes 150 and the storage node contact holes 160 with a conductive layer, portions of the conductive layer deposited above a top surface of the third insulation layer 146 may be selectively removed using a planarization process such as a chemical mechanical polishing (CMP) process or an etch-back process. The mask pattern 210 may be removed during the planarization process or may be removed prior to formation of the conductive layer.

Before the conductive layer is formed in the bit line contact holes 150 and the storage node contact holes 160, at least one of an ohmic layer and a diffusion barrier layer may be additionally formed in the bit line contact holes 150 and the storage node contact holes 160. In such an embodiment, the conductive layer may be formed on the ohmic layer or the diffusion barrier layer. The ohmic layer may be formed to include, for example, a titanium silicide layer or a tantalum silicide layer. The diffusion barrier layer may be formed to include, for example, a titanium nitride layer or a tantalum nitride layer.

Figure 7A:
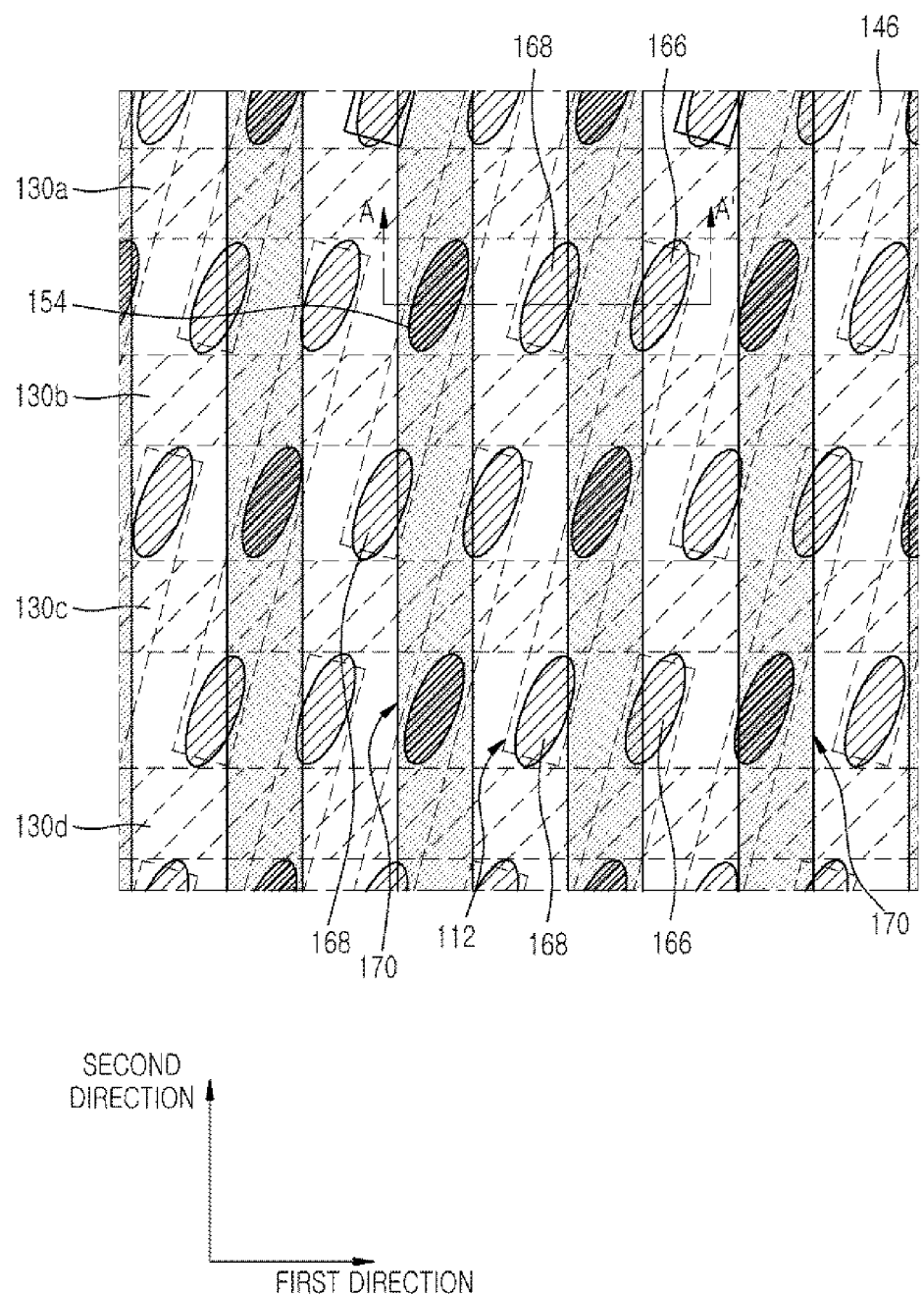
Figure 7B:
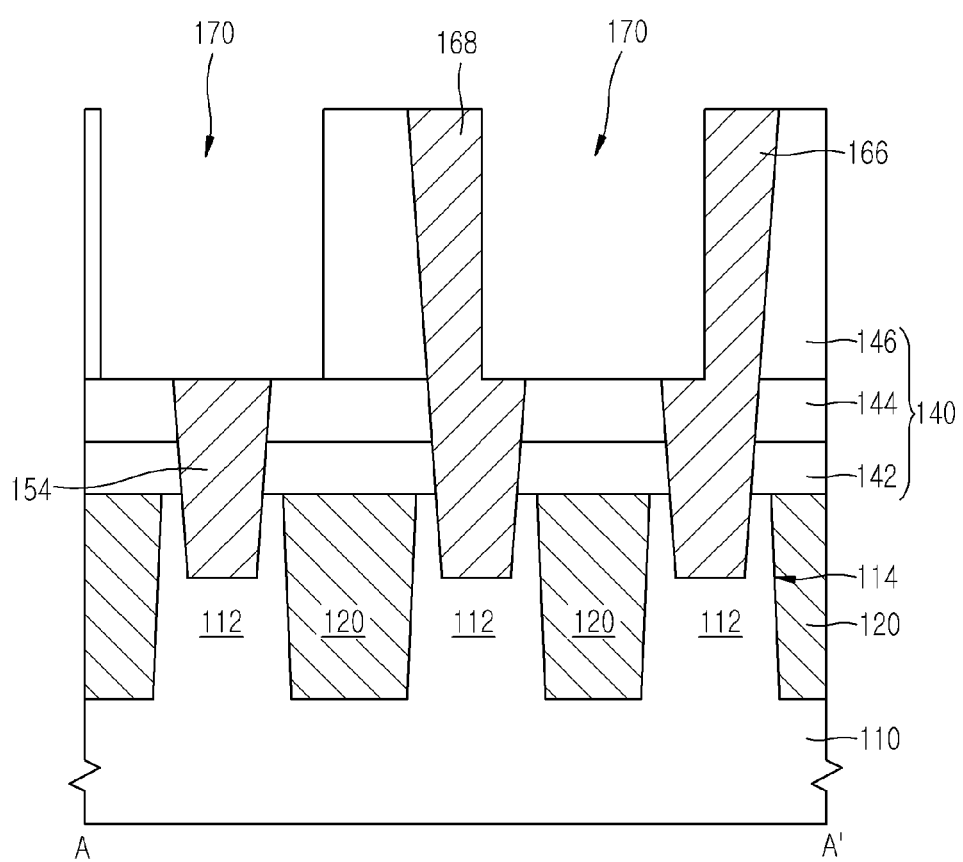

Referring to FIGS. 7A and 7B, a portion of each of the first and second contact plugs 152, 162 and 164 may be recessed to form trench patterns 170 extending in the second direction. According to some embodiments, the third insulation layer 146, and the first and second contact plugs 152, 162 and 164 may be selectively etched until the second insulation layer 144 is exposed, thereby forming bit line contact plugs 154, storage node contact plugs 166 and 168, and the trench patterns 170. As illustrated in a plan view of FIG. 7A, the trench patterns 170 may be formed to expose the bit line contact plugs 154 and to be parallel with the second direction.

The trench patterns 170 may be formed by etching portions of the storage node contact plugs 166 and 168 adjacent to each other along the first direction. As a result, when the trench patterns 170 are formed, the first contact plugs 152 may be recessed to form the bit line contact plugs 154 and portions of the second contact plugs 162 and 164 may be etched to form the storage node contact plugs 166 and 168. In a resulting structure, adjacent storage node contact plugs 166 and 168 include horizontal steps facing one another and defined by a lower surface of trench 170. Furthermore, an upper surface of bit line contact plug 154 may be level with the horizontal steps of storage node contact plugs 166 and 168.

Figure 8A:
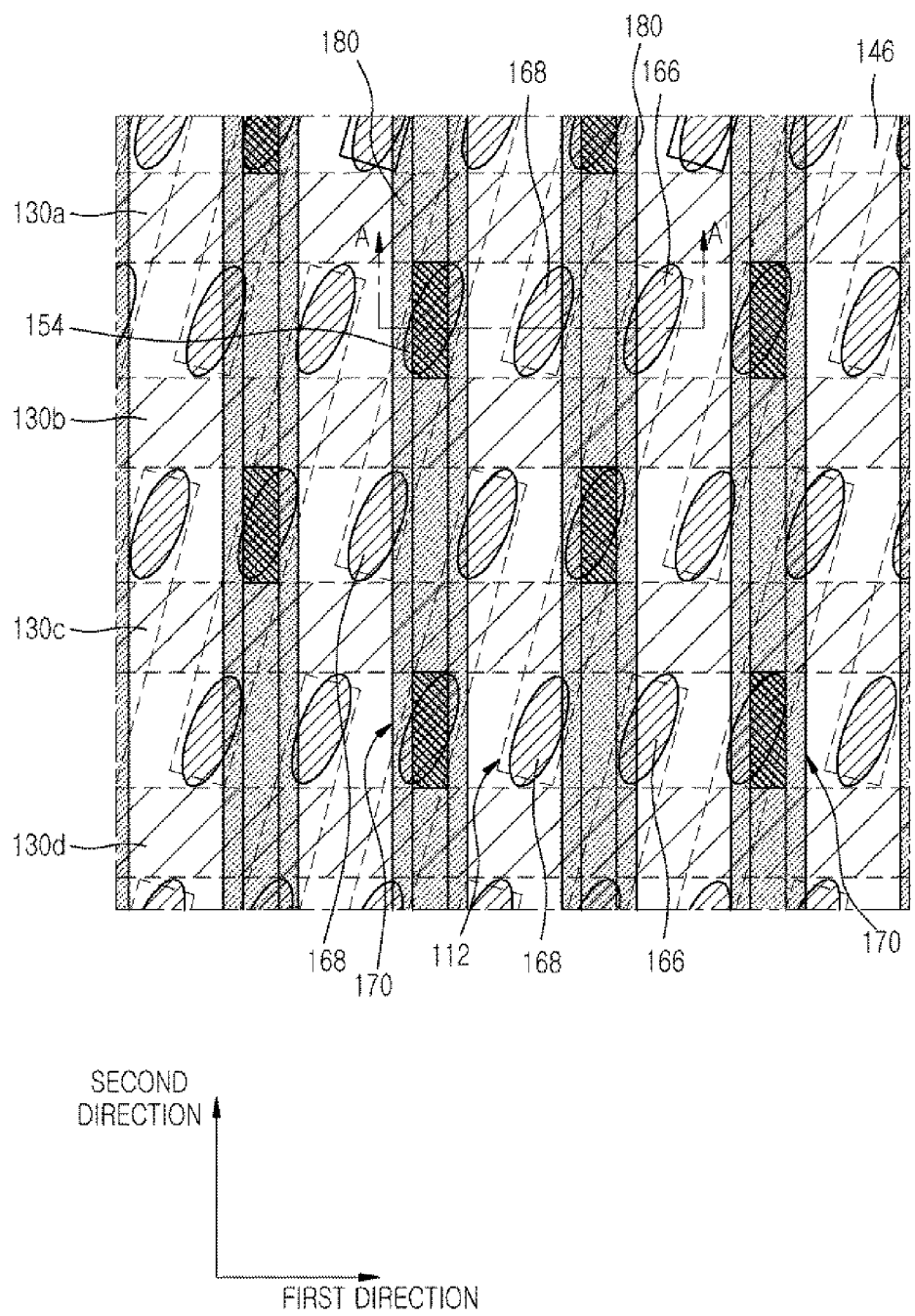
Figure 8B:
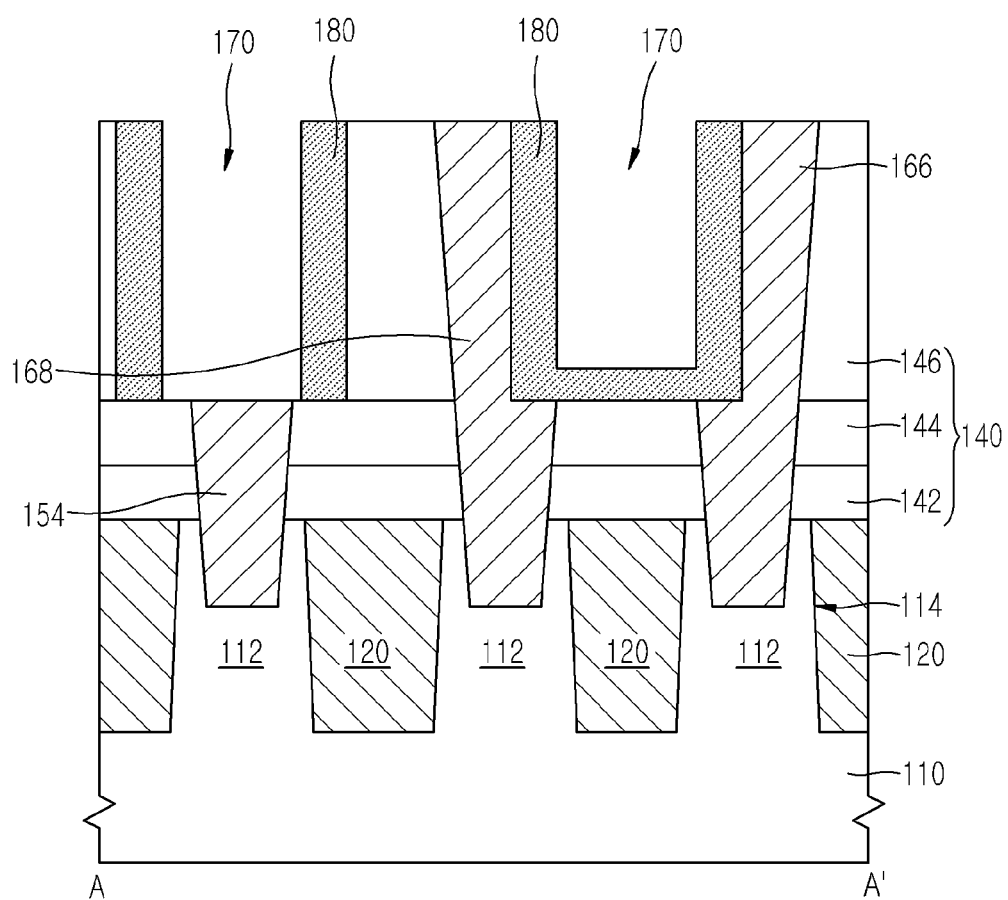

Referring to FIGS. 8A and 8B, an insulation layer 180 may be formed on sidewalls and bottom surfaces of the trench patterns 170. The insulation layer 180 may be etched to expose the bit line contact plugs 154. As seen in FIG. 8B, portions of the insulation layer 180 may be formed to have a spacer shape which establishes a space between sidewalls of trench 170 and a structure subsequently formed in the trench. The insulation layer 180 may be formed of, for example, an oxide layer, a nitride layer or a combination thereof.

Figure 9A:
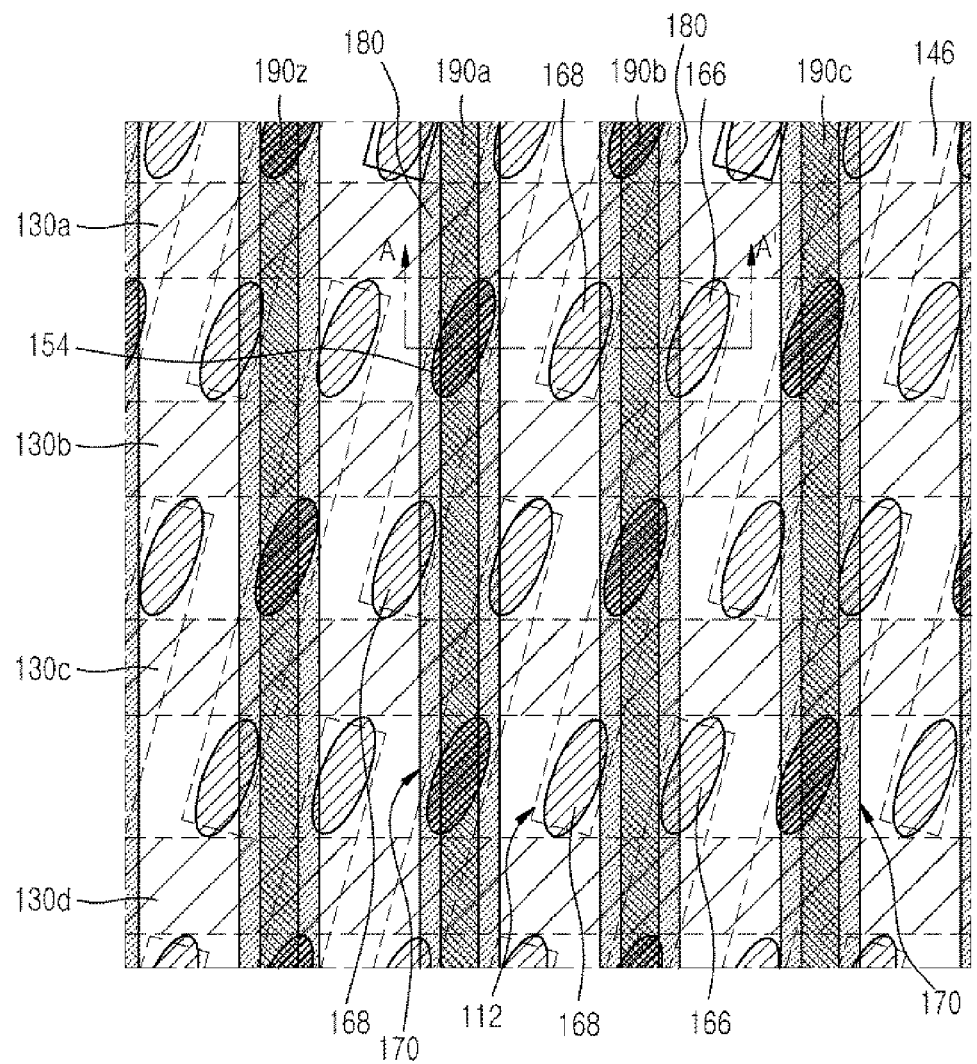
Figure 9B:
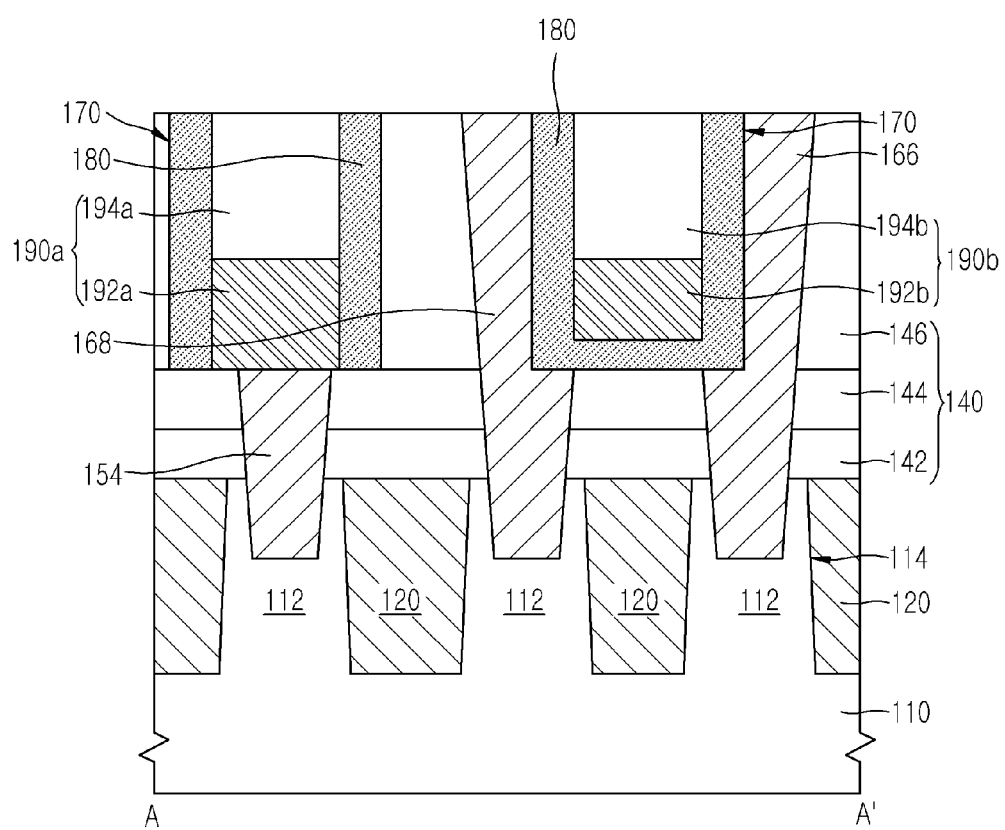

Referring to FIGS. 9A and 9B, bit line structures 190a and 190b may be formed in the trench patterns 170 over the insulation layer 180. The bit line structures 190a and 190b may be formed using the following processes.

First, a conductive layer may be formed to fill the trench patterns 170 over the insulation layer 180 using a chemical vapor deposition (CVD) process or a physical vapor deposition (PVD) process. The conductive layer may be formed to include a metal layer or a metal nitride layer. For example, the conductive layer may be formed of a tungsten layer or a tungsten nitride layer. The conductive layer may then be recessed by a predetermined depth in the trench patterns 170 to form bit line conductive patterns 192a and 192b in the trench patterns 170 over the insulation layer 180. In some embodiments, the conductive layer may then be recessed using an etch-back process.

Bit line hard mask patterns 194a and 194b may be formed in the trench patterns 170 on the bit line conductive patterns 192a and 192b. Each of the bit line hard mask patterns 194a and 194b may be formed to include an insulation layer such as an oxide layer or a nitride layer. The bit line hard mask patterns 194a and 194b may be formed by depositing a hard mask layer using a CVD process and by planarizing the hard mask layer using an etch-back process or a chemical mechanical polishing (CMP) process.

Figure 10A:
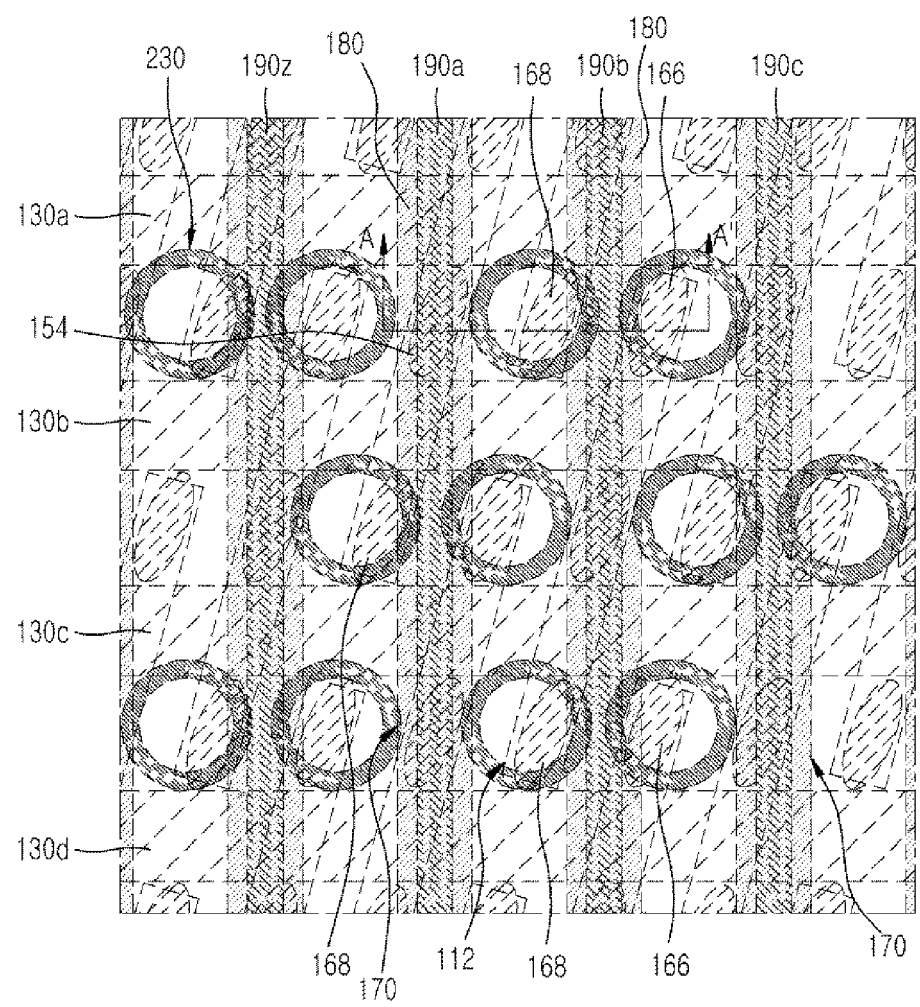
Figure 10B:
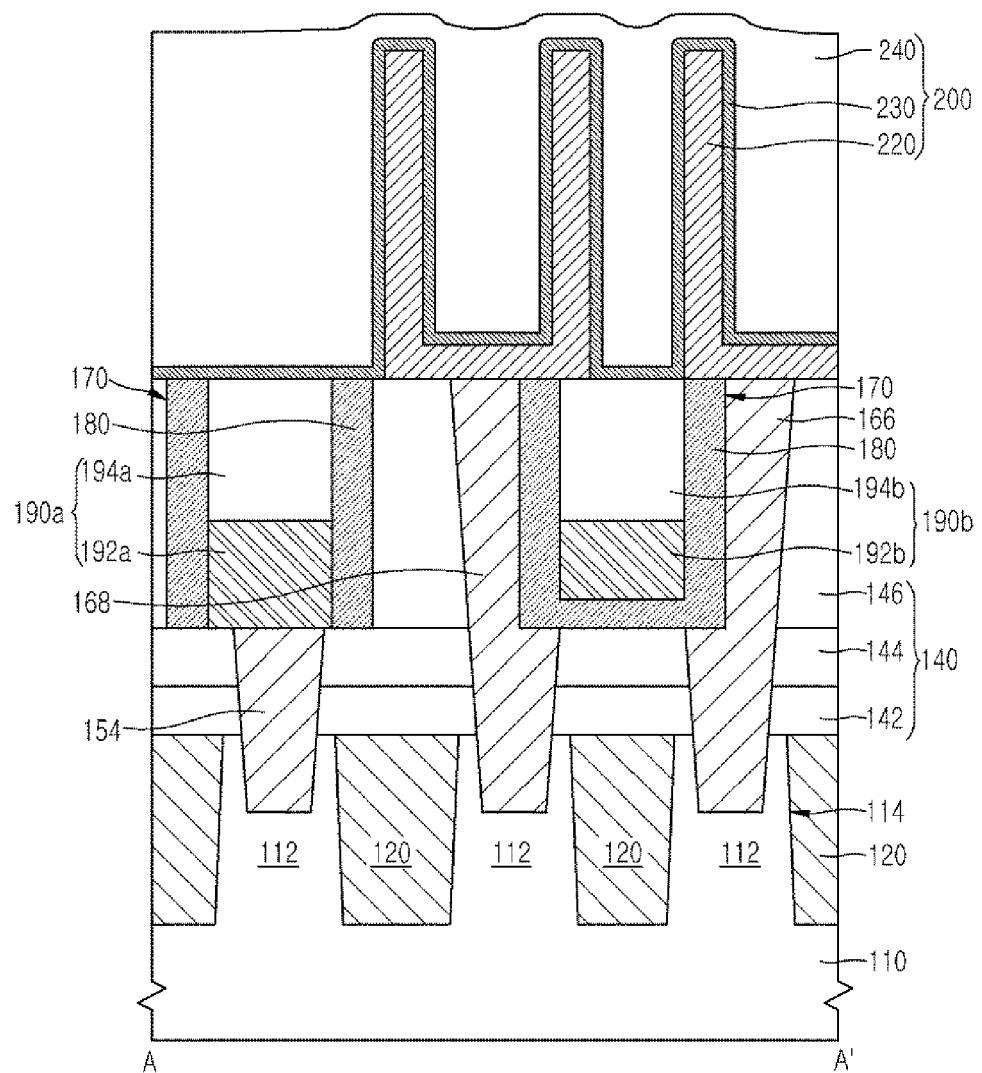

Referring to FIGS. 10A and 10B, capacitors 200 (e.g., cell capacitors) may be formed on the storage node contact plugs 166 and 168. Specifically, storage node electrodes 220, which are electrically connected to the storage node contact plugs 166 and 168, may be formed. As illustrated in FIG. 10B, each of the storage node electrodes 220 may have a cylindrical shape, but embodiments are not limited thereto. For example, each of the storage node electrodes 220 may have a stack-type structure, a concave-type structure or the like. Subsequently, a capacitor dielectric layer 230 may be formed on the storage node electrodes 220, and an upper electrode 240 (also referred to as a plate electrode) may be formed on the capacitor dielectric layer 230. The storage node electrodes 220 and the upper electrode 240 may be formed to include a metal layer or a metal nitride layer. For example, the capacitor dielectric layer 230 may be formed of a zirconium oxide layer, a hafnium oxide layer, an aluminum oxide layer or a titanium oxide layer.

In some embodiments, second storage node contact plugs, which are electrically connected to the storage node contact plugs 166 and 168, may be formed on the storage node contact plugs 166 and 168. In some embodiments, the second storage node contact plugs may be formed to have a width which is greater than an upper width of the storage node contact plugs 166 and 168. That is, the second storage node contact plugs may compensate for a width of the storage node contact plugs 166 and 168 that is reduced because of the intrusion of the trench patterns 170. As a result, contact resistance values between the second storage node contact plugs and capacitors formed in a subsequent process may be reduced, and an alignment margin between the second storage node contact plugs and the capacitors may be increased. Subsequently, the storage node electrodes 220 may be formed on the second storage node contact plugs, and the capacitor dielectric layer 230 and the upper electrode 240 may be sequentially formed on the second storage node contact plugs.

Figure 11:
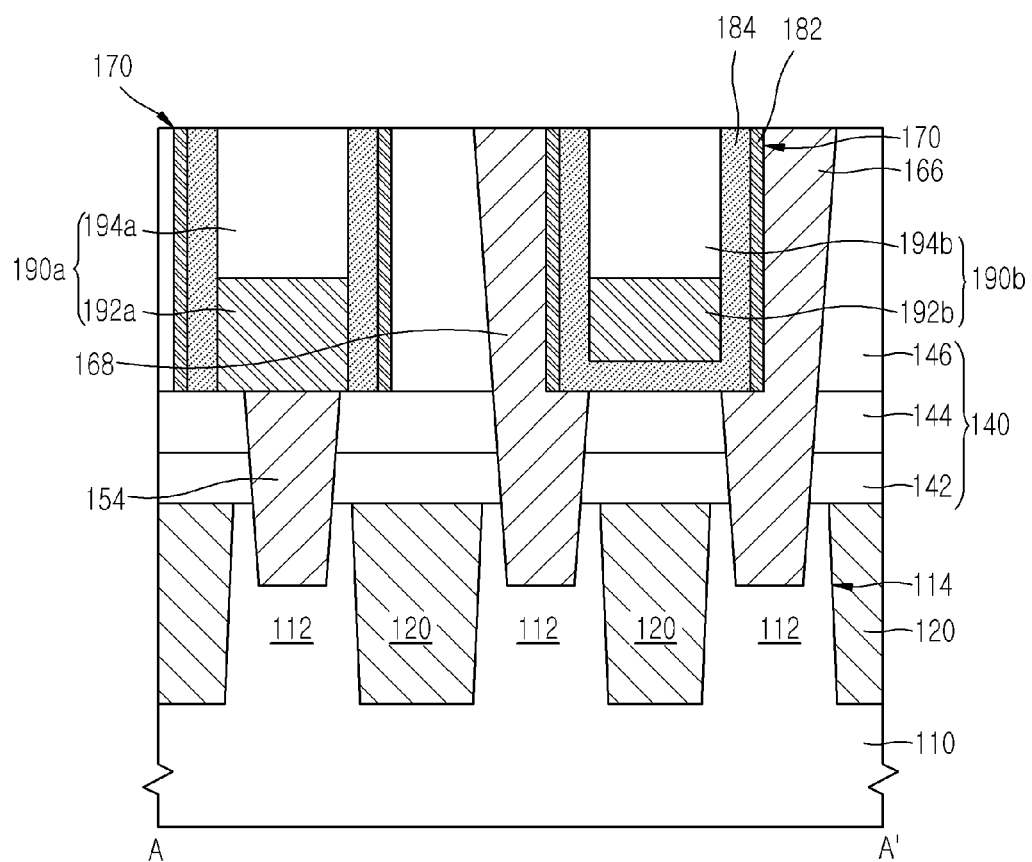
FIGS. 11 and 12 are cross-sectional views illustrating a semiconductor device and fabrication method according to another embodiment of the present disclosure.

Referring to FIG. 11, trench patterns 170 and the underlying structures may be formed on a substrate 110 using substantially the same processes as described with reference to FIGS. 4A to 7A and FIGS. 4B to 7B. A sacrificial insulation layer 182 may be formed on sidewalls of the trench patterns 170. The sacrificial insulation layer 182 may be formed of, for example, an oxide layer, a nitride layer, an oxynitride layer or a combination thereof. An insulation layer 184 may be formed over exposed surfaces of the trench patterns 170. The insulation layer 184 may be formed of a material layer having an etch selectivity with respect to the sacrificial insulation layer 182. The insulation layer 184 may be formed of, for example, an oxide layer, a nitride layer, an oxynitride layer or a combination thereof.

Bit line structures 190*a* and 190*b* may be formed in the trench patterns 170 over the insulation layer 184. The bit line structures 190*a* and 190*b* may be formed using substantially the same method as described with reference to FIGS. 9A and 9B. After the bit line hard mask patterns 194*a* and 194*b* are formed using a planarization process, the insulation layer 184 and the sacrificial insulation layer 182 may be exposed.

Figure 12:
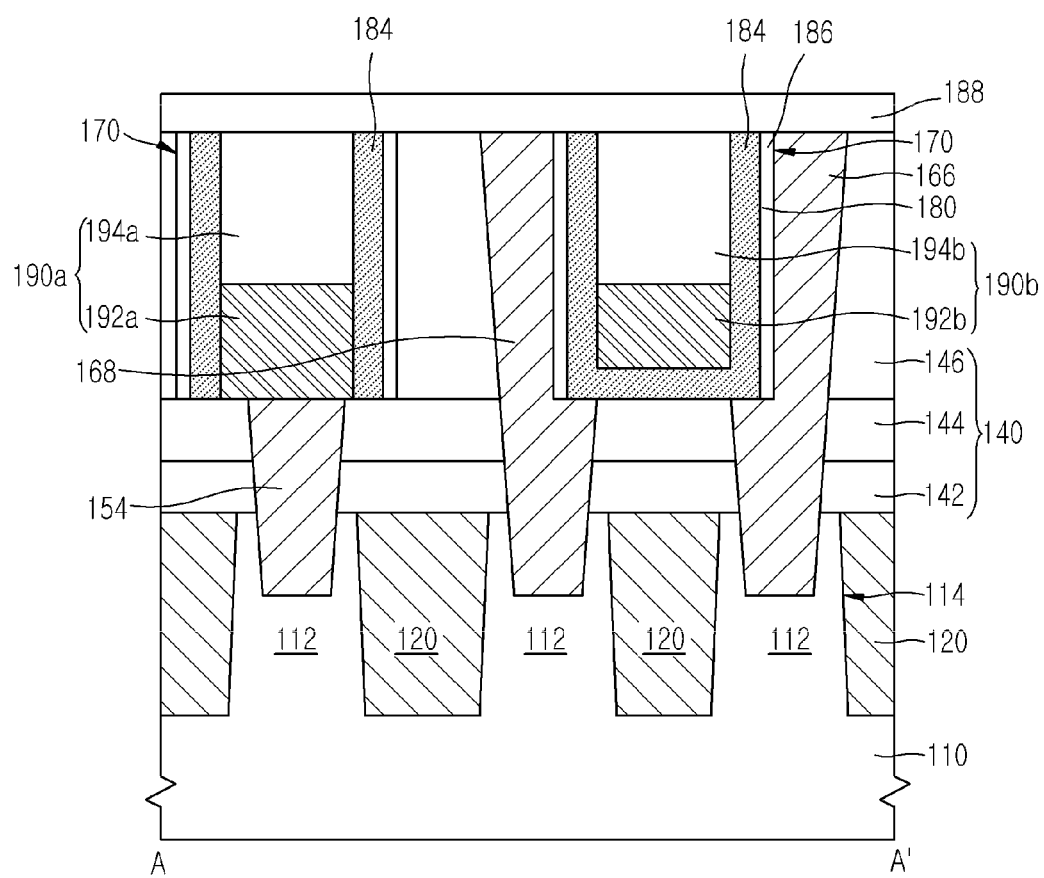

Referring to FIG. 12, the exposed sacrificial insulation layer 182 may be selectively removed to form air gaps 186. The exposed sacrificial insulation layer 182 may be selectively removed using a dry etch process, a wet etch process or a combination thereof. After forming the air gaps 186, an insulation layer 188 may be formed on the substrate covering the air gaps 186.

Subsequently, capacitors 200 may be formed on the storage node contact plugs 166 and 168 using substantially the same processes as described with reference to FIGS. 10A and 10B. In an embodiment, the insulation layer 188 may be patterned so that the storage node electrodes (220 of FIG. 10B) of the capacitors 200 are electrically coupled to the storage node contact plugs 166 and 168. Accordingly, semiconductor devices including the bit line structures 190*a* and 190*b* in the trench structures 170 may be fabricated.

As described above, in embodiments of the present disclosure, trench patterns may be formed on bit line contact plugs to intrude into storage node contact plugs and bit line structures may be formed in the trench patterns. The bit line structures may be electrically insulated from the storage node contact plugs by an insulation layer formed in the trench patterns. Electrical characteristics and parasitic capacitance values between the bit line structures and the storage node contact plugs may be efficiently controlled by appropriately selecting a thickness and a material of the insulation layer formed between the bit line structures and the storage node contact plugs.

Furthermore, according an embodiment, the bit line structures may be formed by forming and filling trench patterns. As a comparative example, a plurality of bit line layers may be sequentially formed on a substrate and the plurality of bit line layers may be patterned to form a plurality of bit line structures. In such a case, if a width of the bit line structures is reduced, the freestanding bit line structures may collapse. In contrast, according to embodiments of this disclosure, bit line structures may be formed using a damascene process. Thus, the bit line structures may be reliably formed without collapsing.

A semiconductor device according to the above embodiments may further include various circuits that control an operation of memory cells in a cell region such as the cell region illustrated in FIGS. 1A, 1B and 2. For example, the semiconductor device may further include a sense amplifier circuit, a power supply circuit, a repairable redundancy circuit, a signal transmission/output circuit and the like. The various circuits may be disposed in a core region and a peripheral region adjacent to the cell region. The semiconductor device may have a semiconductor chip shape. Moreover, the semiconductor device may be mounted on a package substrate including an integrated circuit and may be encapsulated by a molding compound material to form a semiconductor package.

Figure 13A:
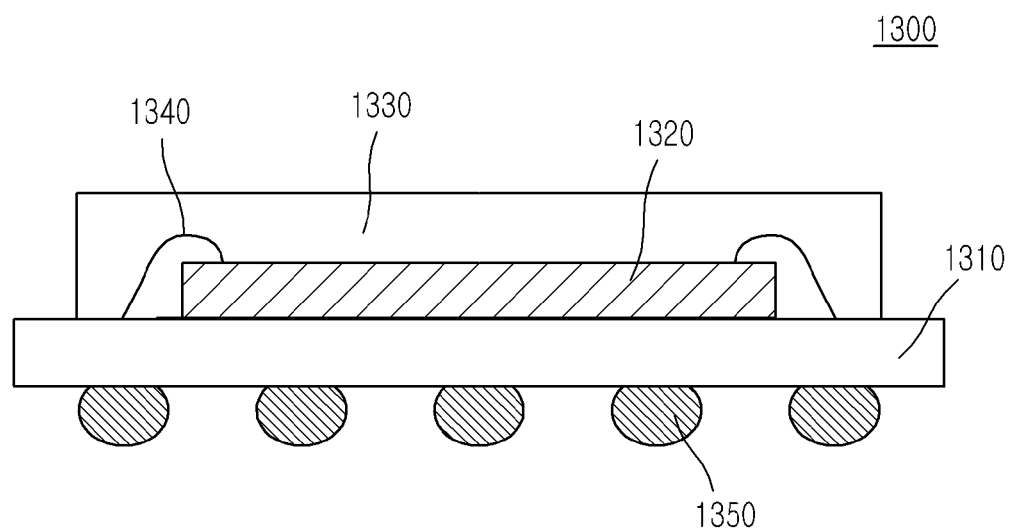
FIG. 13A is a cross-sectional view illustrating a semiconductor package according to an embodiment of the present disclosure.
Figure 13B:
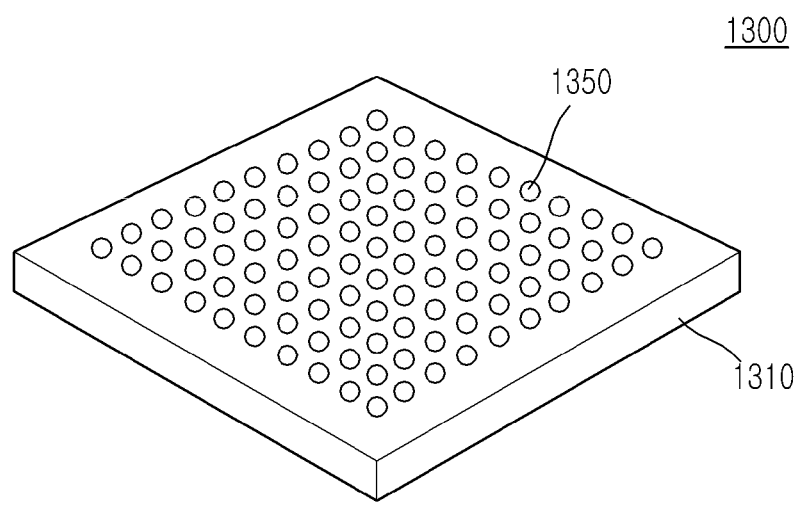
FIG. 13B is a perspective view illustrating a semiconductor package according to an embodiment of the present disclosure.

Referring to FIGS. 13A and 13B, a semiconductor package 1300 according to some embodiments may include a package substrate 1310 having an integrated circuit (not shown), a semiconductor device 1320 mounted on the package substrate 1310, and a molding compound material 1330 covering the semiconductor device 1320.

In some embodiments, the semiconductor device 1320 may be a semiconductor device according to an embodiment of the present disclosure. The semiconductor device 1320 may be realized to have a chip shape and may be electrically connected to the integrated circuit of the package substrate 1310 through a conductive structure 1340 such as bonding wires. In other embodiments, the conductive structure 1340 may be bumps. The semiconductor package 1300 may further include connection terminals 1350 which are electrically connected to an external device. As illustrated, the connection terminals 1350 may be solder balls, conductive lands, a ball grid array (BGA) or a land grid array (LGA).

The semiconductor package shown in FIG. 13 1300 is merely an example of a suitable semiconductor package. Thus, the semiconductor package 1300 may be embodied in different forms. For example, the semiconductor package 1300 may be realized to have any one shape of a small outline package (SOP), a zigzag in-line package (ZIP), a plastic lead chip carrier (PLCC) package, a quad flat package (QFP), and a small outline J-lead (SOJ) package.

Moreover, the semiconductor package 1300 may be a chip stack package in which a plurality of semiconductor devices are stacked on a package substrate, and each of the plurality of semiconductor devices may be a semiconductor device according to an embodiment of the present disclosure. In some embodiments, the semiconductor package 1300 may further include active elements and/or passive elements in addition to the semiconductor device according to an embodiment. That is, the semiconductor package 1300 may be a system-in-package including electronic elements.

According to the semiconductor package 1300 described above, parasitic capacitance values between the bit line structures and the storage node contact plugs in the cell region may be reduced to improve an operation speed of the semiconductor package 1300. In addition, electrical shortage characteristics between the bit line structures and the storage node contact plugs in the cell region may be improved to realize a reliable semiconductor package.

Figure 14:
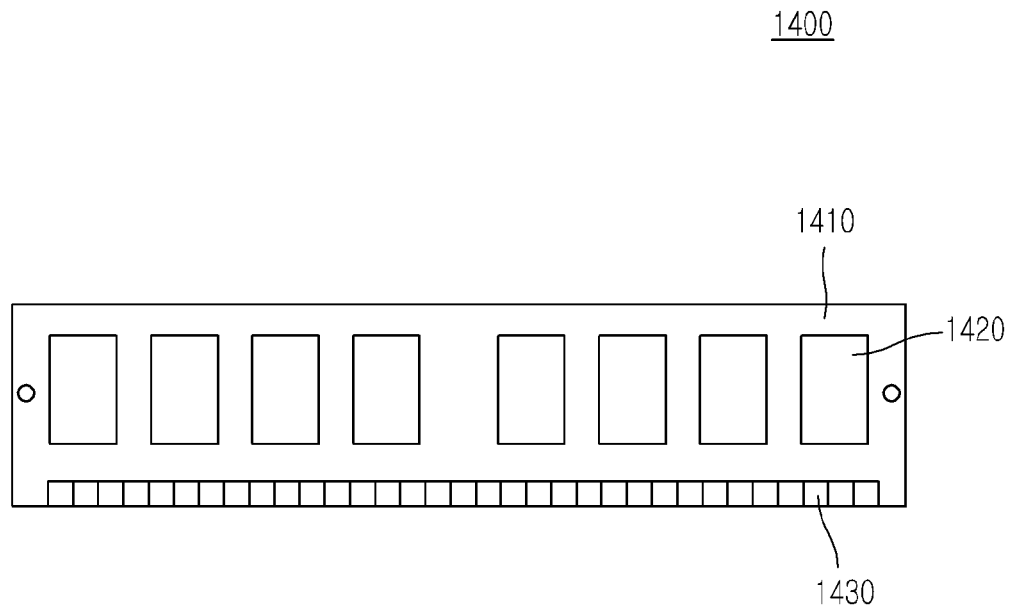
FIG. 14 is a schematic view illustrating a package module according to an embodiment of the present disclosure.

Referring to FIG. 14, a package module 1400 may include a printed circuit board (PCB) 1410, a plurality of semiconductor packages 1420 electrically connected to the PCB 1410, and a connector 1430 disposed at a side of the PCB 1410.

The PCB 1410 may include an integrated circuit. The PCB 1410 may a multi-layered circuit substrate including a plurality of substrates which are stacked. Although not shown in the drawings, connection pads may be disposed on the PCB 1410 to electrically connect the semiconductor packages 1420 to the PCB 1410.

The semiconductor packages 1420 may be mounted on the PCB 1410 and may be electrically connected to the integrated circuit of the PCB 1410. In some embodiments, at least one of the semiconductor packages 1420 may include a semiconductor device according to an embodiment of the present disclosure. In such a case, the semiconductor device according to an embodiment may include a plurality of memory cells located at intersections of a plurality of bit line structures and a plurality of word line structures, and each of the memory cells may include a capacitor that stores data therein.

The connector 1430 may electrically connect the package module 1400 to a processing system such as a computer. Accordingly, data signals and/or control signals may be transmitted through connector 1430 for communication between the package module 1400 and the processing system. A shape of the connector 1430 may vary between embodiments according to a connection type of a processing system.

In some embodiments, the package module 1400 may be a memory module. In such a case, the package module 1400 may be a single in-line memory module (SIMM) in which the semiconductor packages 1420 are mounted on one surface of the PCB 1410 or a dual in-line memory module (DIMM) in which the semiconductor packages 1420 are mounted on both opposite surfaces of the PCB 1410.

The package module 1400 may include different types of semiconductor packages. For example, at least one of the semiconductor packages 1420 may include a semiconductor device according to an embodiment of the present disclosure, and one or more of the semiconductor packages 1420 may include a semiconductor device having an integrated circuit for controlling a system.

As described above, the package module 1400 may include a semiconductor device according to an embodiment. Thus, parasitic capacitance values between the bit line structures and the storage node contact plugs in the cell region may be reduced to improve information processing speed of the package module 1400. In addition, electrical shortage characteristics between the bit line structures and the storage node contact plugs in the cell region may be improved to realize a highly reliable package module.

Figure 15:
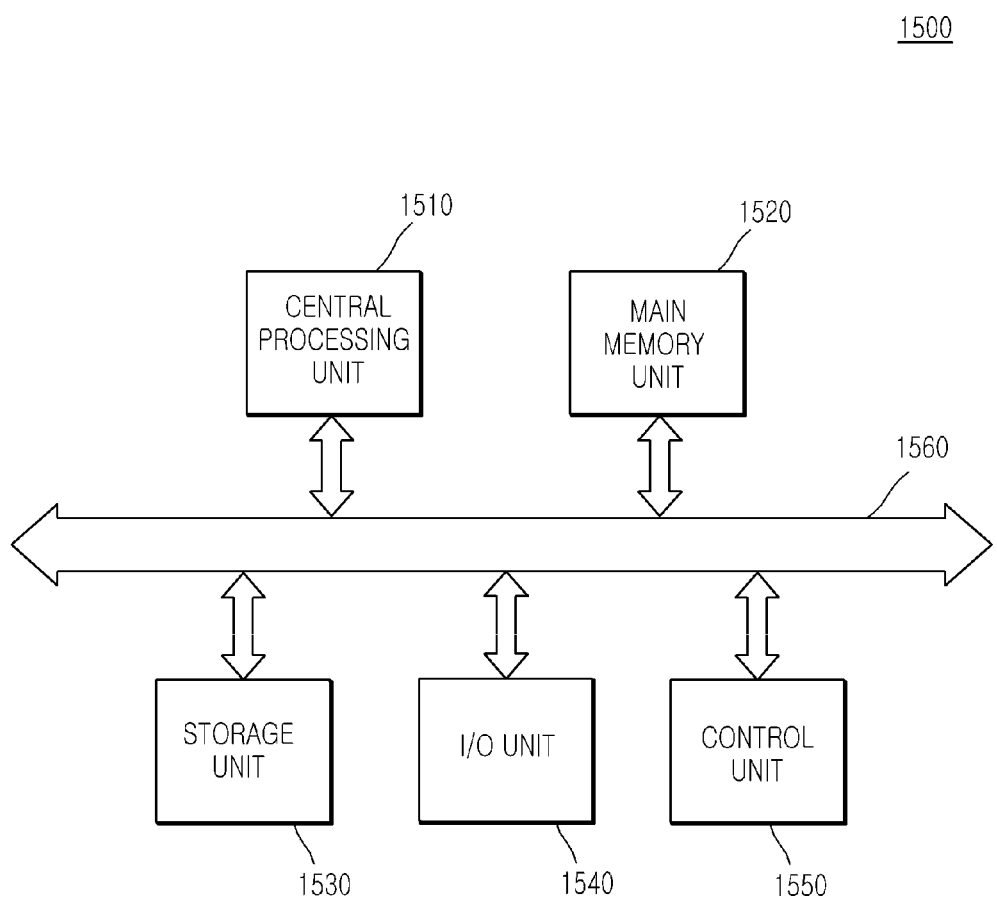
FIG. 15 is a block diagram illustrating a processing system according to an embodiment of the present disclosure.

Referring to FIG. 15, a processing system 1500 may include a central processing unit (CPU) 1510, a main memory unit 1520, a storage unit 1530, an input/output (I/O) unit 1540, and a control unit 1550. The CPU 1510, the main memory unit 1520, the storage unit 1530, the I/O unit 1540 and the control unit 1550 may communicate with each other through a system bus 1560.

The CPU 1510 may execute programs installed in the processing system 1500 and may process data stored in the processing system 1500. The CPU 1510 may include, for example, a register, an arithmetic logic unit (ALU) and a control unit. The CPU 1510 may perform one-way communication or bidirectional communication with the main memory unit 1520, the storage unit 1530 or the I/O unit 1540 to receive or transmit information on address signals, data or control signals through the system bus 1560.

The main memory unit 1520 may preserve data to be processed by the CPU 1510 or may store results processed by the CPU 1510. Further, the main memory unit 1520 may store input data received through the I/O unit 1540 or output data through the I/O unit 1540. The main memory unit 1520 may include, for example, at least one dynamic random access memory (DRAM) device.

The main memory unit 1520 may include a plurality of memory cells, each of which stores one bit of data. The main memory unit 1520 may include a semiconductor device according to an embodiment of the present disclosure. That is, the main memory unit 1520 may include a plurality of memory cells located at intersections of a plurality of bit line structures and a plurality of word line structures, and each of the plurality of memory cells may include a capacitor that stores data. The semiconductor device may be employed in the semiconductor package 1300 illustrated in FIG. 13 or in the package module 1400 illustrated in FIG. 14, and the semiconductor package 1300 or the package module 1400 may be employed in the main memory unit 1520.

The storage unit 1530 may store data to assist the main memory unit 1520. For example, the storage unit 1530 may store data to be processed by the main memory unit 1520 and may provide the main memory unit 1520 with a portion of the stored data. The storage unit 1530 may include a magnetic tape, a magnetic disk such as a floppy diskette or a hard disk, a compact disc read only memory (CD ROM), an optical disc such as a laser disc or a digital video disc (DVD), a flash memory device, a solid state drive (SSD), a universal serial bus (USB) memory, a secure digital (SD) card, a mini secure digital (miniSD) card, a micro secure digital (microSD) card, a secure digital high capacity (SDHC) card, a memory stick card, a smart media (SM) card, a multi-media card (MMC), an embedded multi-media card (eMMC), a compact flash (CF) card or the like.

The I/O unit 1540 may receive data processed by the CPU 1510 or may output the data to the CPU 1510. For example, the I/O unit 1540 may include a keypad, a keyboard, a mouse, a speaker, a microphone, a display unit, a printer, an interface unit such as a graphics card, or a communication unit. The communication unit may include a cable network module that can be connected to a cable network, a wireless network module that can be connected to a wireless network, or a combination thereof. The cable network module may include one of various cable units that can transmit and receive the data through a transmission line. For example, the cable network module may include a cable local area network (LAN), a USB, an Ethernet or a power line communication (PLC) unit. The wireless network module may include one of various wireless units that can transmit and receive the data without any transmission lines. For example, the wireless network module may include an infrared data association (IrDA) unit, a wireless LAN, a Zigbee, a ubiquitous sensor network (USN), a Bluetooth, a radio frequency identification (RFID), a near field communication (NFC), a wireless broadband internet (Wibro), etc.

The control unit 1550 may control data or signals transmitted between the CPU 1510, the main memory unit 1520, the storage unit 1530 and the I/O unit 1540. The control unit 1550 may be, for example, a north bridge chip or a south bridge chip in a computer.

The system bus 1560 may act as an information path through which data and signals are transmitted between the CPU 1510, the main memory unit 1520, the storage unit 1530, the I/O unit 1540 and the control unit 1550. The system bus 1560 may include, for example, an address bus, a data bus and a control bus.

According to some embodiments, the processing system 1500 may include a main board corresponding to a printed circuit board (PCB). The CPU 1510, the main memory unit 1520 and the control unit 1550 may be mounted on the main board. In some embodiments, the CPU 1510 or the control unit 1550 may be encapsulated to have a shape of the semiconductor package described with reference to FIGS. 13A and 13B and may be mounted on the main board. The main memory unit 1520 may be encapsulated to have a shape of the semiconductor package described with reference to FIGS. 13A and 13B and may be mounted on the main board. Alternatively, the main memory unit 1520 may be realized to have a shape of the package module described with reference to FIG. 14 and may be combined with the main board. The main board may be, for example, a multi-layered circuit substrate. The storage unit 1530 and the I/O unit 1540 may be provided as separate products and may be connected to an I/O interface unit installed on the main board. The system bus 1560 may be realized using an integrated circuit in the CPU 1510, the main memory unit 1520, the storage unit 1530, the I/O unit 1540 or the control unit 1550 or using an integrated circuit in the main board.

As a result, the processing system 1500 may include a semiconductor package employing a semiconductor device according to an embodiment of the present disclosure. For example, the main memory unit 1520 of the processing system 1500 may include a package module composed of the semiconductor package employing a semiconductor device according an embodiment of the present disclosure. Thus, an operation speed of the main memory unit 1520 or the reliability of data stored in the main memory unit 1520 may be improved to realize a high performance processing system.

Figure 16:
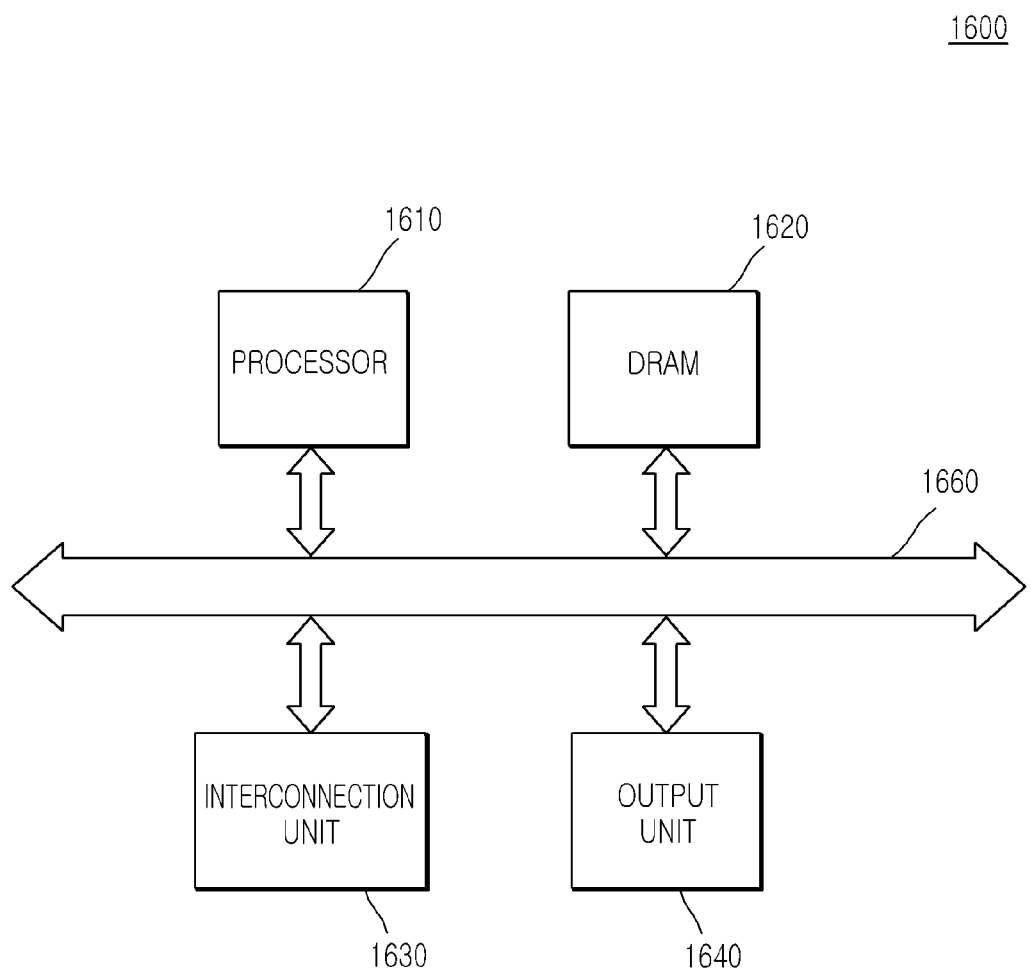
FIG. 16 is a block diagram illustrating a graphics card according to an embodiment of the present disclosure.

Referring to FIG. 16, a graphics card 1600 may include a processor 1610, a DRAM device 1620, an interconnection unit 1630 and an output unit 1640. The processor 1610, the DRAM device 1620, the interconnection unit 1630 and the output unit 1640 may communicate with each other through a system bus 1660.

The processor 1610 may execute operations for processing and accelerating various video signals. The processor 1610 may include a graphics processing unit (GPU). The DRAM device 1620 may store video data which are processed by the processor 1610. The DRAM device 1620 may include a plurality of memory cells, each of which stores one bit of the video data. The DRAM device 1620 may include a semiconductor device according to an embodiment of the present disclosure. That is, the DRAM device 1620 may include a plurality of memory cells located at intersections of a plurality of bit line structures and a plurality of word line structures, and each of the memory cells may include a capacitor that stores data therein.

The interconnection unit 1630 may electrically connect the graphics card 1600 to a computer system. Accordingly, control signals and/or data signals may be transmitted through interconnection unit 1630 for communication between the graphics card 1600 and the computer system. The interconnection unit 1630 may include, for example, accelerated graphics port (AGP) slots or peripheral component interconnect (PCI) slots. The output unit 1640 may output video information processed by the processor 1610 to a display unit.

According to some embodiments, the graphics card 1600 may include a main board corresponding to a PCB. The processor 1610 and the DRAM device 1620 may be mounted on the main board. In some embodiments, the processor 1610 or the DRAM device 1620 may be encapsulated to have a shape of the semiconductor package described with reference to FIGS. 13A and 13B and may be mounted on the main board. The main board may be, for example, a multi-layered circuit substrate. The interconnection unit 1630 and the output unit 1640 may include an I/O interface unit disposed on the main board. The system bus 1660 may be realized using an integrated circuit in the processor 1610, the DRAM device 1620, the interconnection unit 1630 or the output unit 1640 or using an integrated circuit in the main board.

As a result, the graphics card 1600 may include a DRAM device corresponding to a semiconductor device according to an embodiment of the present disclosure. Thus, an operation speed of the DRAM device 1620 and the reliability of data stored in the DRAM device 1620 may be improved to realize a high performance graphics card.

Figure 17:
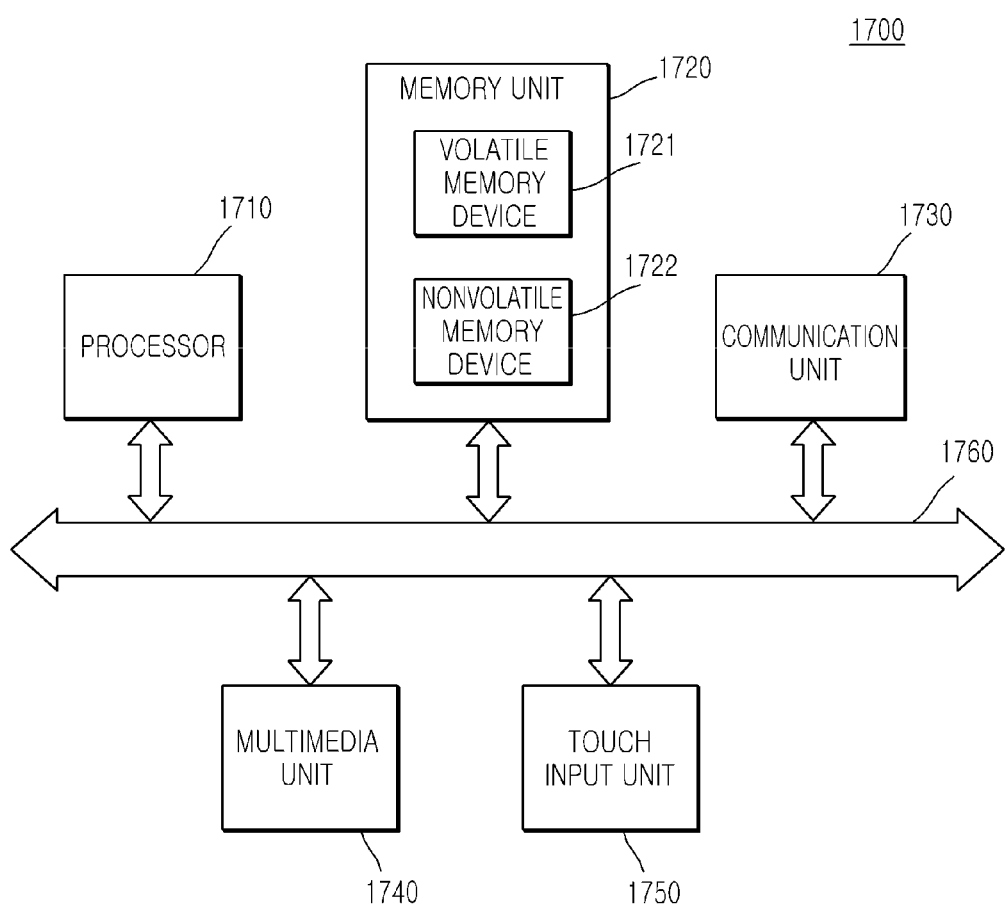
FIG. 17 is a block diagram illustrating a mobile system according to an embodiment of the present disclosure.

Referring to FIG. 17, a mobile system 1700 may include a processor 1710, a memory unit 1720, a communication unit 1730, a multimedia unit 1740 and a touch input unit 1750. The processor 1710, the memory unit 1720, the communication unit 1730, the multimedia unit 1740 and the touch input unit 1750 may communicate with each other through a system bus 1760.

The processor 1710 may include an application processor for utilization of the mobile system 1700. The processor 1710 may execute an operating system (OS) and may control all components of the mobile system 1700. The processor 1710 may include, for example, a CPU, a GPU, a multimedia processor (MMP), or a digital signal processor (DSP). The processor 1710 may have a system-on-chip configuration.

The memory unit 1720 may preserve data to be processed by the processor 1710 or may store results processed by the processor 1710. The memory unit 1720 may include, for example, a volatile memory device 1721 and a nonvolatile memory device 1722. The volatile memory device 1721 may include a plurality of memory cells, and each of the plurality of memory cells may store one bit of data. The volatile memory device 1721 may include a semiconductor device according to an embodiment of the present disclosure. That is, the volatile memory device 1721 may include a plurality of memory cells located at intersections of a plurality of bit line structures and a plurality of word line structures, and each of the plurality of memory cells may include a capacitor that stores data. The nonvolatile memory device 1722 may include, for example, a NOR-type flash memory device or a NAND-type flash memory device. Alternatively, the memory unit 1720 may include another nonvolatile memory device such as a read only memory (ROM) device, a phase change random access memory (PRAM) device, a resistive random access memory (RRAM) device, a spin transfer torque random access memory (STTRAM) device or a magnetic random access memory (MRAM) device.

The communication unit 1730 may include a radio frequency (RF) transceiver. The RF transceiver may include a transmission part and a receiving part. The transmission part may modulate an original signal into an RF signal which may transmit the RF signal through an antenna. The receiving part may receive the RF signal and may demodulate the RF signal into the original signal. The RF transceiver may be configured to use a communication system such as long term evolution (LTE), code division multiple access (CDMA), global system for mobile communication (GSM), time division multiple access (TDMA), frequency division multiple access (FDMA), high speed packet access (HSPA), high speed downlink packet access (HSDPA), wideband CDMA (WCDMA), or ultra wideband (UWB).

In addition, the communication unit 1730 may include a cable network module, a wireless network module or a combination thereof. The cable network module may include a USB unit. The wireless network module may include an infrared data association (IrDA) unit, a wireless LAN, a Zigbee, a ubiquitous sensor network (USN), a Bluetooth, a radio frequency identification (RFID), a near field communication (NFC) unit, a universal asynchronous receiver transmitter (UART) or a frequency modulation (FM) receiver.

The multimedia unit 1740 may include, for example, a camera, an audio set, a two-dimensional or three-dimensional graphics unit, a display unit or an audio/video output unit. The multimedia unit 1740 may execute a logical operation or an I/O operation of multimedia data according to a control signal of the processor 1710.

The touch input unit 1750 may sense user's touch to receive data. The touch input unit 1750 may include, for example, a keypad or a touch screen unit.

According to some embodiments, the mobile system 1700 may include a main board corresponding to a PCB. The processor 1710, the memory unit 1720, the communication unit 1730, the multimedia unit 1740 or the touch input unit 1750 may be mounted on the main board. In such a case, the processor 1710, the memory unit 1720, the communication unit 1730, the multimedia unit 1740 or the touch input unit 1750 may be encapsulated to have a shape of the semiconductor package described with reference to FIGS. 13A and 13B and may be mounted on the main board. The main board may be, for example, a multi-layered circuit substrate. The system bus 1760 may be realized using an integrated circuit in the processor 1710, the memory unit 1720, the communication unit 1730, the multimedia unit 1740 or the touch input unit 1750 or using an integrated circuit in the main board.

As a result, the mobile system 1700 may include a memory unit 7020 having a semiconductor device according to an embodiment of the present disclosure. Thus, an operation speed of the memory unit 1720 or the reliability of data stored in the memory unit 1720 may be improved to realize a high performance mobile system.

Figure 18:
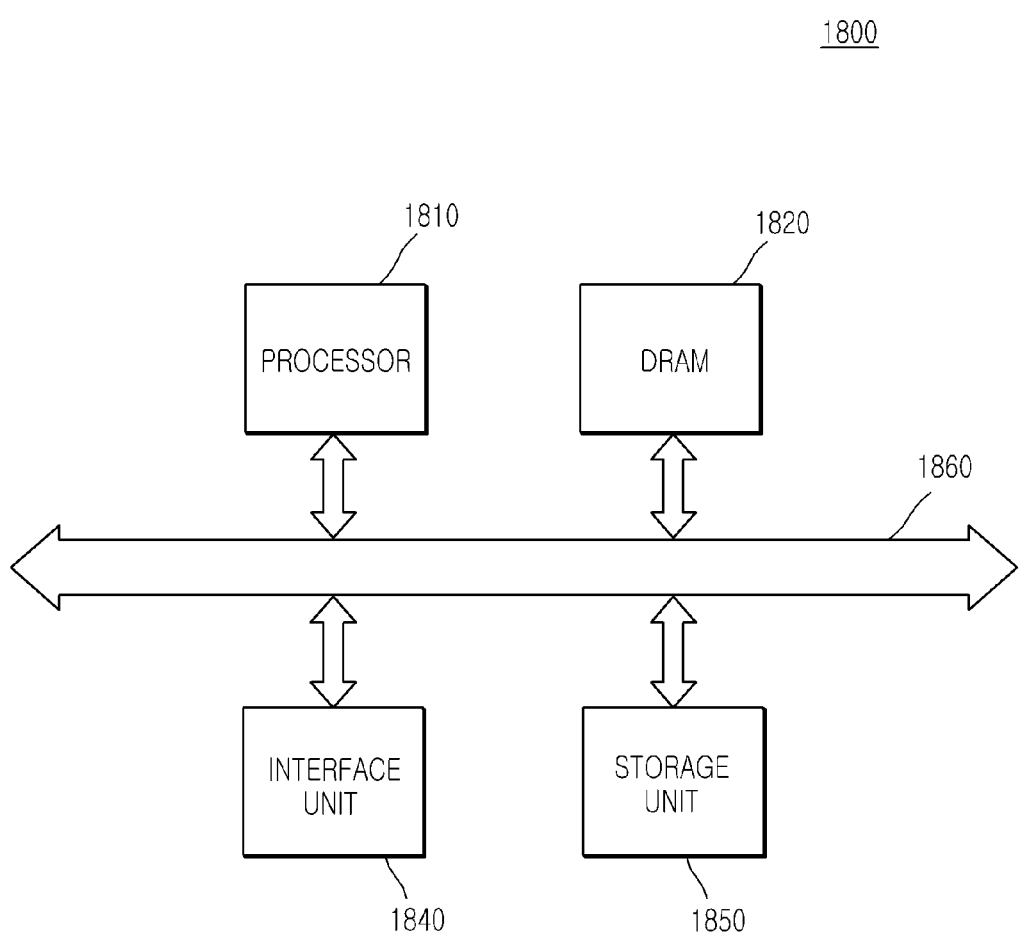
FIG. 18 is a block diagram illustrating an electronic system according to an embodiment of the present disclosure.

FIG. 18 is a block diagram illustrating an electronic system according to an embodiment of the present disclosure. The electronic system may include, for example, a digital television, a set top box, a blu-ray system, a digital video disc (DVD) system, a digital still camera, a car navigator, an electronic control unit for automobiles or a printer system.

Referring to FIG. 18, the electronic system 1800 may include a processor 1810, a DRAM device 1820, an interface unit 1840 and a storage unit 1850. The processor 1810, the DRAM device 1820, the interface unit 1840 and the storage unit 1850 may communicate with each other through a system bus 1860.

The processor 1810 may execute various logical operations according to a function of the electronic system 1800 or may control components of the electronic system 1800. For example, the processor 1810 may execute software programs or logical operations of the electronic system 1800.

The DRAM device 1820 may preserve data to be processed by the processor 1810 and supplied from the storage unit 1850 or may temporarily store data processed by the processor 1810. The DRAM device 1820 may act as a buffer for improving a processing speed of the processor 1810.

The DRAM device 1820 may include a plurality of memory cells, and each of the plurality of memory cells may store one bit of data. The DRAM device 1820 may include a semiconductor device according to an embodiment of the present disclosure. That is, the DRAM device 1820 may include a plurality of memory cells located at intersections of a plurality of bit line structures and a plurality of word line structures, and each of the plurality of memory cells may include a capacitor that stores data. According to an embodiment of the present disclosure, a probability of an electrical shortage failure between storage node contact plugs connected to the capacitors and the bit line structures may be reduced to improve data retention of the DRAM device 1820.

The interface unit 1840 may make a smooth and harmonious data communication between the electronic system 1800 and an external system.

The storage unit 1850 may store data to be processed by the processor 1810 or data processed by the processor 1810. The storage unit 1850 may include a nonvolatile memory device and may supply data stored in the nonvolatile memory device to the DRAM device 1820 such that the data are sequentially processed by the processor 1810. In some embodiments, the electronic system 1800 may be configured to include the processor 1810, the DRAM device 1820 and the interface unit 1840 without the storage unit 1850.

According to some embodiments, the electronic system 1800 may include a main board corresponding to a PCB. The processor 1810 or the DRAM device 1820 may be encapsulated to have a shape of the semiconductor package described with reference to FIGS. 13A and 13B and may be mounted on the main board. Alternatively, the DRAM device 1820 may be realized to have a shape of the package module described with reference to FIG. 14 and may be combined with the main board. The interface unit 1840 or the storage unit 1850 may be provided as separate products and may be combined with the electronic system 1800 to communicate with the main board. The system bus 1860 may be realized using an integrated circuit in the processor 1810, the DRAM device 1820, the interface unit 1840 or the storage unit 1850 or using an integrated circuit in the main board.

As a result, the electronic system 1800 may include a DRAM device employing a semiconductor device according to an embodiment of the present disclosure. Thus, an operation speed of the DRAM device 1820 or the reliability of data stored in the DRAM device 1820 may be improved to realize a high performance electronic system.

Embodiments of the present disclosure have been described above for illustrative purposes. Those skilled in the art will appreciate that various modifications, additions and substitutions are possible, without departing from the scope and spirit of the present disclosure as disclosed in the accompanying claims.

What is claimed is:

1. A semiconductor device comprising:
   a bit line contact plug and a storage node contact plug electrically connected to an active region of a substrate; and
   a bit line structure disposed in a trench pattern on the bit line contact plug and extending in a first direction,
   wherein the trench pattern intrudes into a side of the storage node contact plug.

2. The semiconductor device of claim 1, wherein a portion of the storage node contact plug is removed to form the trench pattern.

3. The semiconductor device of claim 1, wherein the bit line structure is electrically insulated from the storage node contact plug by an insulation layer disposed in the trench pattern.

4. The semiconductor device of claim 3,
   wherein the insulation layer is disposed on sidewalls and a bottom surface of the trench pattern; and
   wherein the bit line structure penetrates a portion of the insulation layer to be electrically connected to the bit line contact plug.

5. The semiconductor device of claim 3, wherein the insulation layer includes an oxide layer, a nitride layer or a combination thereof.

6. The semiconductor device of claim 3, further comprising an air gap disposed between the insulation layer and a sidewall of the trench pattern.

7. The semiconductor device of claim 3, wherein a width of the bit line structure is controlled by a width of the trench pattern or a thickness of the insulation layer.

8. The semiconductor device of claim 1, wherein each of the bit line contact plug and the storage node contact plug includes a metal layer or a metal nitride layer.

9. The semiconductor device of claim 1, wherein the storage node contact plug is one of a pair of adjacent storage node contact plugs, and the adjacent storage node contact plugs include steps facing one another and defined by the trench pattern.

10. A semiconductor device comprising:
   a trench pattern disposed between a pair of first conductive plugs to extend in a first direction, the trench pattern including recesses intruding into opposing sides of the pair of first conductive plugs; and
   a line structure disposed in the trench pattern on a second conductive plug which is spaced apart from the pair of first conductive plugs.

11. The semiconductor device of claim 10,
   wherein each of the pair of first conductive plugs includes a storage node contact plug,
   wherein the second conductive plug includes a bit line contact plug, and
   wherein the line structure includes a bit line structure.

12. The semiconductor device of claim 10, wherein the line structure is electrically insulated from the pair of first conductive plugs by an insulation layer disposed on sidewalls and a bottom surface of the trench pattern.

13. The semiconductor device of claim 12, further comprising air gaps disposed between the insulation layer and the sidewalls of the trench pattern.

* * * * *